United States Patent
Fathollahi et al.

(10) Patent No.: US 10,206,470 B2
(45) Date of Patent: Feb. 19, 2019

(54) PROTECTIVE CASE FOR MOBILE DEVICE

(71) Applicant: INCIPIO, LLC, Irvine, CA (US)

(72) Inventors: Andy Fathollahi, Corona Del Mar, CA (US); Timothy Alan Hemesath, Clovis, CA (US); Kitty Yu-Ling Yung, Walnut, CA (US); Carlos Del Toro, Whittier, CA (US)

(73) Assignee: Incipio, LLC, Irvine, CA (US)

( * ) Notice: Subject to any disclaimer, the term of this patent is extended or adjusted under 35 U.S.C. 154(b) by 0 days.

(21) Appl. No.: 15/449,865

(22) Filed: Mar. 3, 2017

(65) Prior Publication Data
US 2017/0172268 A1 Jun. 22, 2017

Related U.S. Application Data

(62) Division of application No. 14/210,411, filed on Mar. 13, 2014, now Pat. No. 9,622,556.

(60) Provisional application No. 61/876,225, filed on Sep. 10, 2013, provisional application No. 61/813,577, filed on Apr. 18, 2013, provisional application No. 61/785,755, filed on Mar. 14, 2013.

(51) Int. Cl.
| | |
|---|---|
| *B65D 85/00* | (2006.01) |
| *A45C 11/00* | (2006.01) |
| *H05K 5/03* | (2006.01) |
| *H05K 5/02* | (2006.01) |
| *H04B 1/3888* | (2015.01) |
| *A45C 13/00* | (2006.01) |
| *A45C 13/10* | (2006.01) |
| *A45F 5/00* | (2006.01) |
| *H04M 1/02* | (2006.01) |

(52) U.S. Cl.
CPC ............ *A45C 11/00* (2013.01); *A45C 13/002* (2013.01); *A45C 13/1076* (2013.01); *A45F 5/00* (2013.01); *H04B 1/3888* (2013.01); *H05K 5/02* (2013.01); *H05K 5/03* (2013.01); *A45C 2011/001* (2013.01); *A45C 2011/002* (2013.01); *A45C 2011/003* (2013.01); *H04M 1/0202* (2013.01)

(58) Field of Classification Search
CPC .............. A45C 11/00; A45C 2011/002; A45C 2011/003
USPC ........... 206/37, 38, 320; 361/679.01, 679.55, 361/679.56; 455/575.1, 575.8
See application file for complete search history.

(56) References Cited

U.S. PATENT DOCUMENTS

| | | | | |
|---|---|---|---|---|
| 8,567,600 B2 * | 10/2013 | Fan | ........................ | A45C 11/00 206/320 |
| 8,584,847 B2 * | 11/2013 | Tages | ................... | H04B 1/3888 206/320 |

(Continued)

*Primary Examiner* — Luan K Bui
(74) *Attorney, Agent, or Firm* — Manatt, Phelps & Phillips, LLP

(57) ABSTRACT

A protective case can be used with a mobile device having front and back surfaces and side surfaces extending between the front and back surfaces, including a top side, a bottom side, a right side, and a left side, the mobile device having a screen on the front surface. The protective case can include a shell configured to engage and substantially surround at least three of the surfaces of the mobile device and preferably all or nearly all surfaces of the mobile device while still capable of allowing the user to functionally interact with biometric sensor (such as a fingerprint sensor) and/or not interfere with the intended functionality of the proximity sensors of the mobile device.

20 Claims, 26 Drawing Sheets

(56) References Cited

U.S. PATENT DOCUMENTS

| | | | |
|---|---|---|---|
| 8,640,868 B2* | 2/2014 | O'Dowd | G06F 1/1628 206/320 |
| 8,675,359 B2* | 3/2014 | Chen | H04B 1/3888 206/305 |
| 2013/0146491 A1* | 6/2013 | Ghali | G06F 1/1626 206/320 |
| 2013/0175186 A1* | 7/2013 | Simmer | A45C 11/00 206/37 |
| 2013/0292269 A1* | 11/2013 | Tages | A45C 11/00 206/37 |
| 2013/0334070 A1* | 12/2013 | Adelman | A45F 5/00 206/37 |
| 2014/0192481 A1* | 7/2014 | Wojcik | H05K 5/0086 361/679.55 |
| 2014/0246339 A1* | 9/2014 | Chung | H04B 1/3888 206/37 |
| 2015/0194994 A1* | 7/2015 | Soriano | H04B 1/3888 455/575.8 |

* cited by examiner

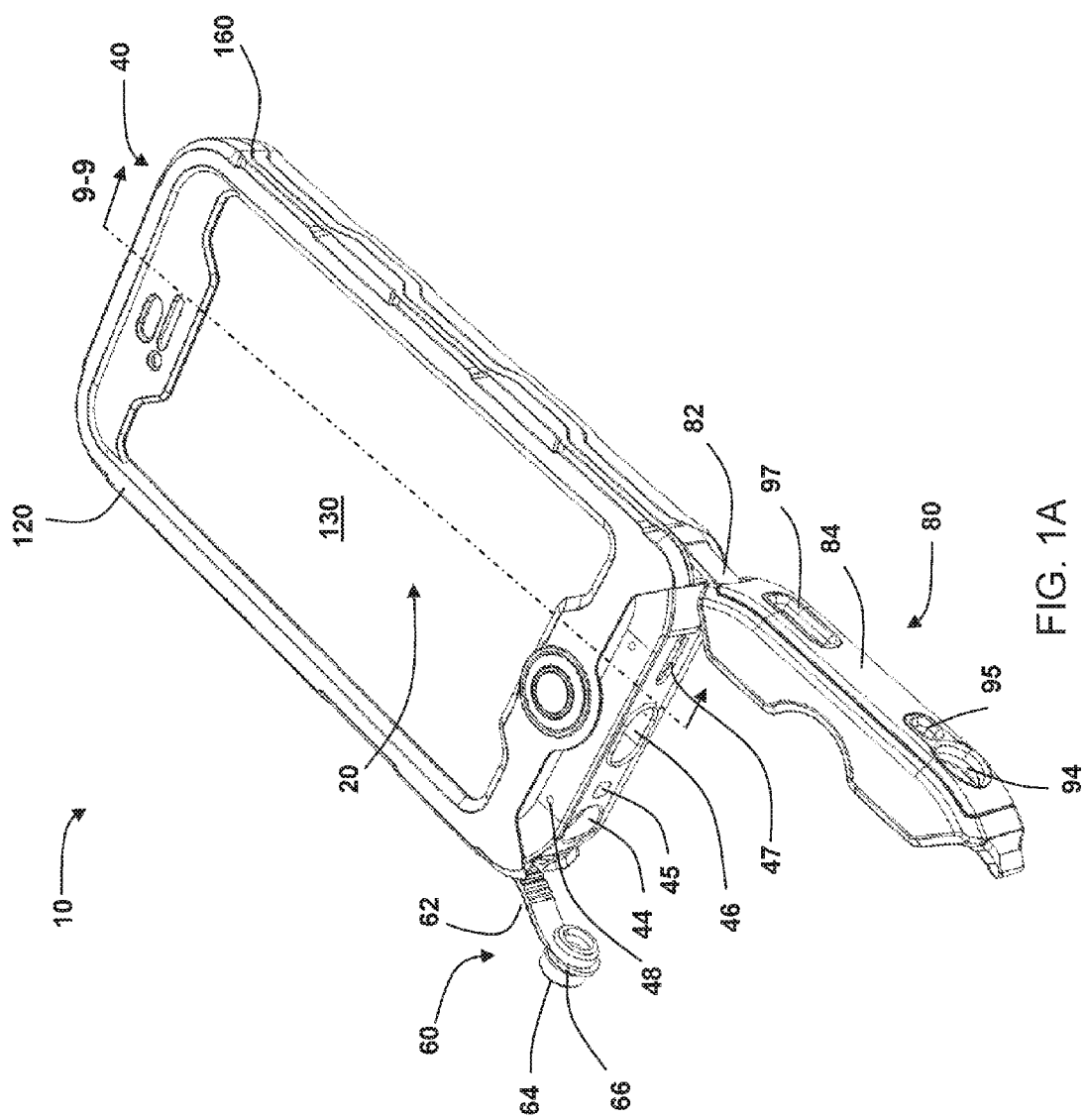

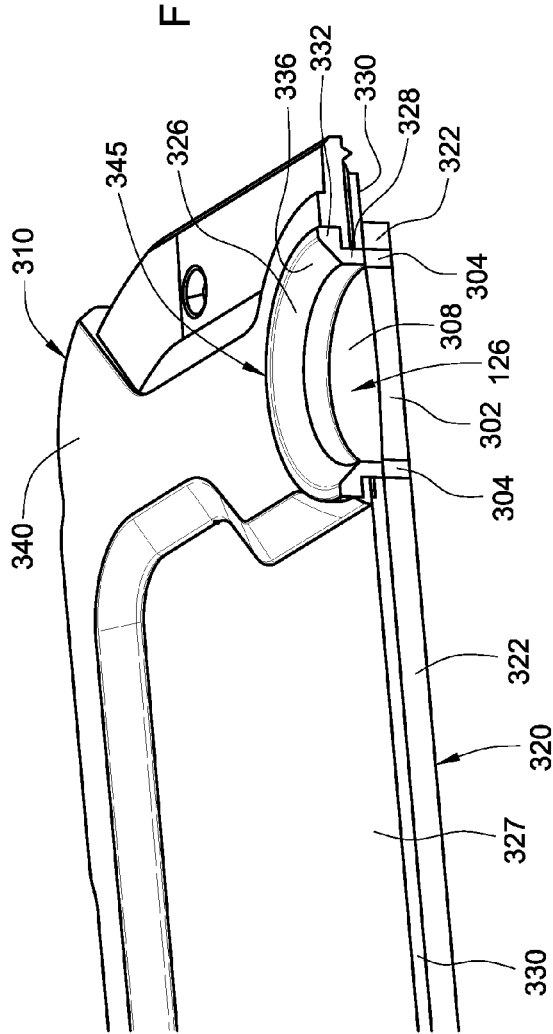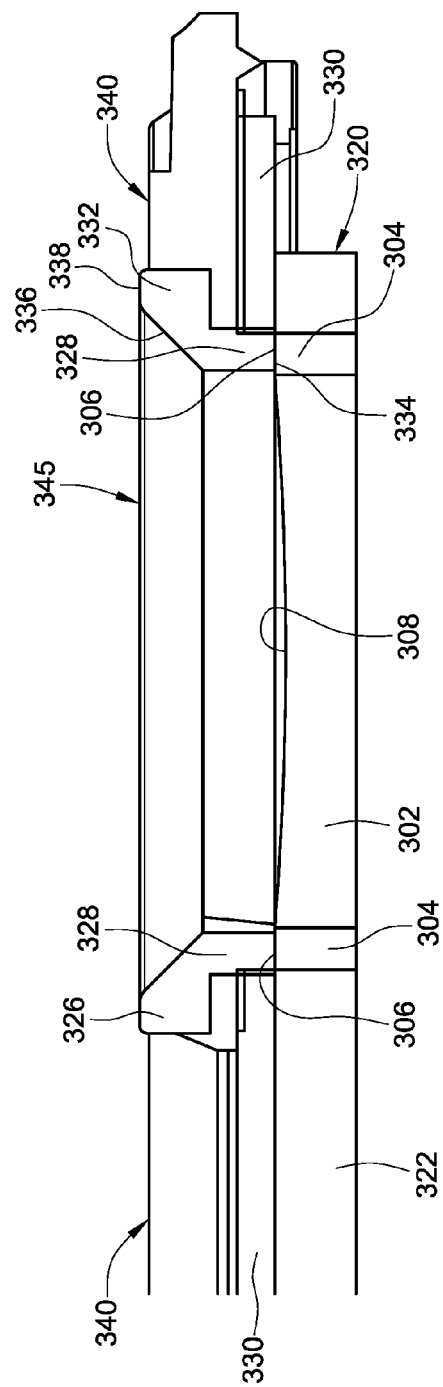

PROTECTIVE CASE FOR MOBILE DEVICE

INCORPORATION BY REFERENCE TO RELATED APPLICATIONS

This application is a divisional of U.S. patent application Ser. No. 14/210,411, filed Mar. 13, 2014, which claims benefit under 35 U.S.C. § 119(e) from U.S. Provisional Application No. 61/785,755, filed on Mar. 14, 2013; U.S. Provisional Application No. 61/813,577, filed on Apr. 18, 2013; and U.S. Provisional Application No. 61/876,225, filed on Sep. 10, 2013. The disclosures of each of the applications cited in this paragraph are incorporated herein by reference in their entireties.

BACKGROUND OF THE INVENTION

Field of the Invention

This patent document relates to protective cases for mobile devices.

Description of the Related Art

Mobile devices are known to sustain damage from impact, such as from a fall or being dropped by a user and from contamination, such as when damaged by water or other fluid. The damage, for example, may result in a cracked screen, scratches on a finished surface, lost or damaged buttons or controls, cracked or bent external body components, and/or failed or malfunctioning electrical components. Cases have thus been provided to protect mobile devices from such and variant types of damage.

Biometric sensors, such as fingerprint sensors, are increasingly being used as a security measure to verify the identity of the user prior to facilitating access or unlocking computing devices including mobile devices. In addition, mobile devices are increasingly being equipped with proximity sensors for detecting the presence of nearby objects, such as a face or pocket, etc. Conventional proximity sensors operate without need of any physical contact with the object, such that when the mobile device is placed in close proximity to a user or put into a pocket, the proximity sensor is triggered and the screen of the mobile device is automatically turned off to save power and/or to prevent unintended operation of the touch interface of the screen by, for example, the face or ear of the user or other objects.

Accordingly, there is a need for protective cases for mobile devices that are capable of not only providing suitable impact protection and protection from the environment such as from moisture and debris, but that are also capable of interfacing with biometric sensors employed by such devices. There is also a need for protective cases that are capable of not interfering with the desired functionality of proximity sensors of such devices.

SUMMARY OF THE INVENTION

There exists a continuing need for new and improved designs for cases for mobile devices that are compatible with biometric sensors and/or proximity sensors employed in such devices.

In one aspect, a protective case is disclosed that includes a user interface that is capable of functionally interfacing with a biometric sensor such as a fingerprint sensor of the mobile device. The user interface of the protective case includes a metallic or conductive element that corresponds in shape (in whole or in part) and is in proximate contact with an electrode element of the fingerprint sensor. The user interface may also include a dielectric element (e.g., a non-metallic or non-conductive material) that is interposed within, or adjacent to, the metallic conductive element and configured to reside above an array of capacitive plates that comprise the sensing mechanism or circuitry of the fingerprint sensor. The conductive element of the user interface may be printed or otherwise, applied, inked or layered on opposing sides of a substrate such as the dielectric element. The fingerprint sensor user interface is incorporated within a protective case that is configured to be removable by the user. In one implementation the user interface is attached to a light-transmissive panel that is configured to cover the front face and touch screen of the mobile device. Various and numerous aspects of the biometric compatible case, including its configuration and construction, are apparent from the various embodiments described and illustrated herein. Methods of use of the biometric case that are capable of conditioning the biometric sensor with the protective case thereon to improve functional reliability of the sensor when the device is enclosed within the protective case are also disclosed.

Yet other aspects disclosed herein relate to the construction of a protective case that is capable of avoiding unintended triggering of proximity sensors of the mobile device for which the case is configured to contain and protect. Various embodiments are disclosed including the use of polarizing elements and light absorbing elements positioned over, between, and/or around the circumference of the proximity sensors. Those elements function to pass directional light and/or absorb light emitted by the proximity sensor so as to limit undesirable or unintended triggering of the proximity sensors by light reflected by the case back to the underlying sensor.

The foregoing various aspects and embodiments of the protective cases summarized above, as well as those disclosed herein, may be combined in any way without limitation.

BRIEF DESCRIPTION OF THE DRAWINGS

These and other features, aspects and advantages are described below with reference to the drawings, which are intended to illustrate but not to limit the invention. In the drawings, like reference characters denote corresponding features consistently throughout similar embodiments.

FIGS. 1A-B are front and back perspective views of an embodiment of a protective case for a mobile device containing the mobile device.

FIG. 10 shows a partial perspective side cross-sectional view of an embodiment of a protective case for a mobile device like the one generally depicted in FIGS. 1-9 wherein the case contains the mobile device. In this embodiment the protective case includes a fingerprint sensor user interface having a conductive element that is configured to interface with the electrode element of a fingerprint sensor, such as that depicted in FIG. 18, and is capable of functionally interfacing with such sensor.

FIG. 11 is a more detailed cross-sectional view of the protective case and mobile device of FIG. 10.

DETAILED DESCRIPTION OF THE PREFERRED EMBODIMENT

Disclosed herein are embodiments of a protective case for a mobile device configured to maintain substantial functionality of the mobile device while both reducing the likelihood of damage to the device due to shocks and other forces sustained by the device and reducing the likelihood of ingress of liquids (such as water), dust, or debris into the protective case when in a fully closed configuration. The embodiments disclosed herein are described in the context of a mobile device case for a cell phone because the embodiments disclosed herein have particular utility in this context. However, the embodiments and inventions herein can also be applied to other types of mobile devices such as, but not limited to, tablets (such as an iPad®), PDAs, e-readers, mp3 players (such as an iPod®), portable gaming devices, and other mobile devices of similar nature. Further, while the embodiments disclosed herein are tailored to correspond with the dimensions and features of the mobile device depicted for which the case is configured to receive, it should be understood that the teachings herein are applicable and transferable to cases configured to receive other mobile and electronic devices.

Figure 1B:
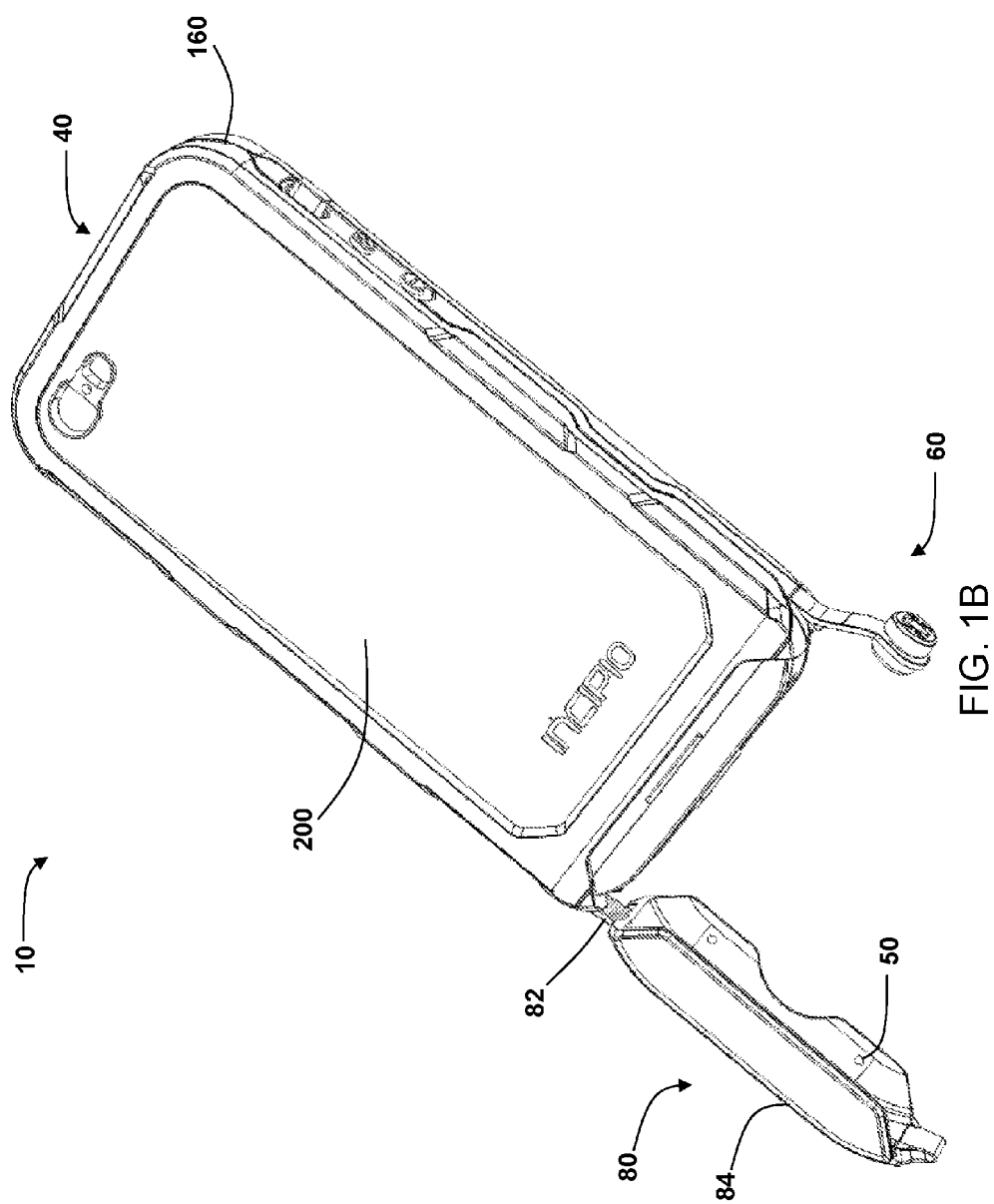
Figure 2A:
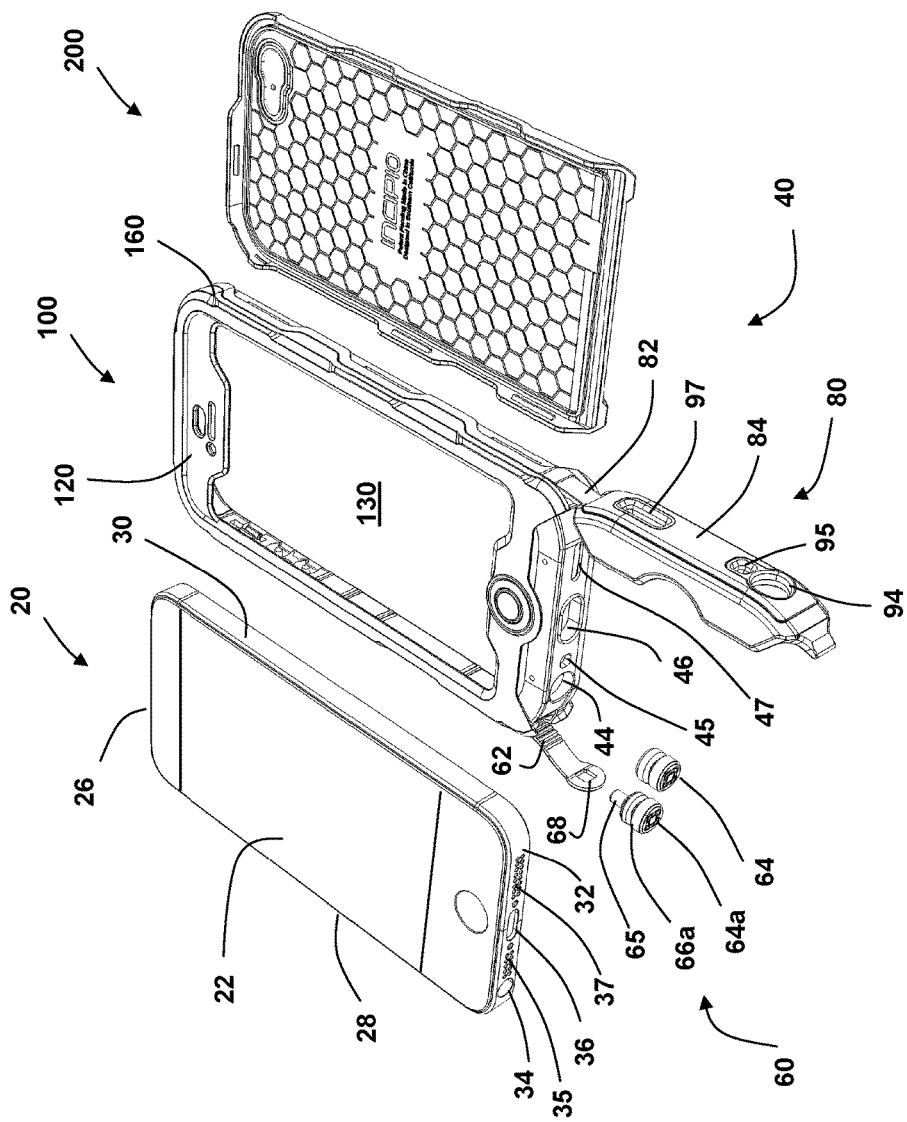
FIG. 2A shows a partially disassembled front view of the protective case of FIG. 1 and a mobile device.
Figure 2B:
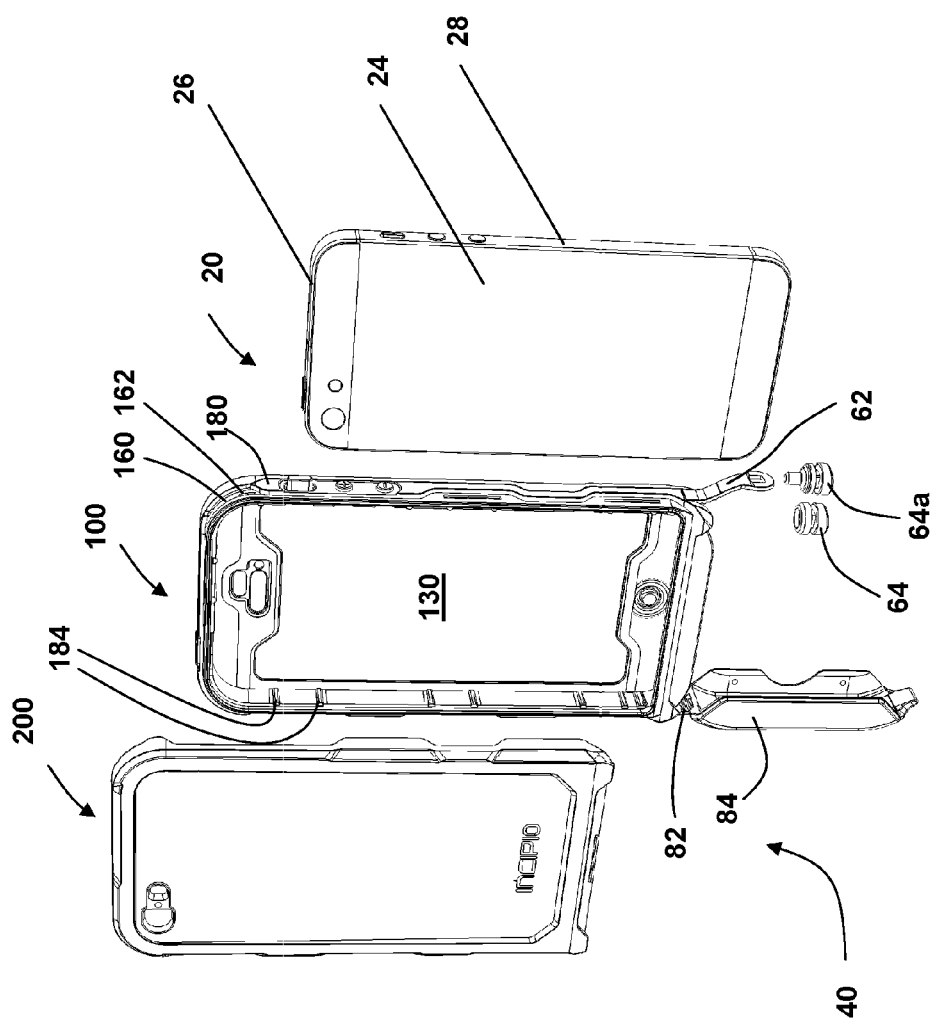
FIG. 2B shows a partially disassembled back view of the protective case of FIG. 1 and a mobile device.
Figure 3:
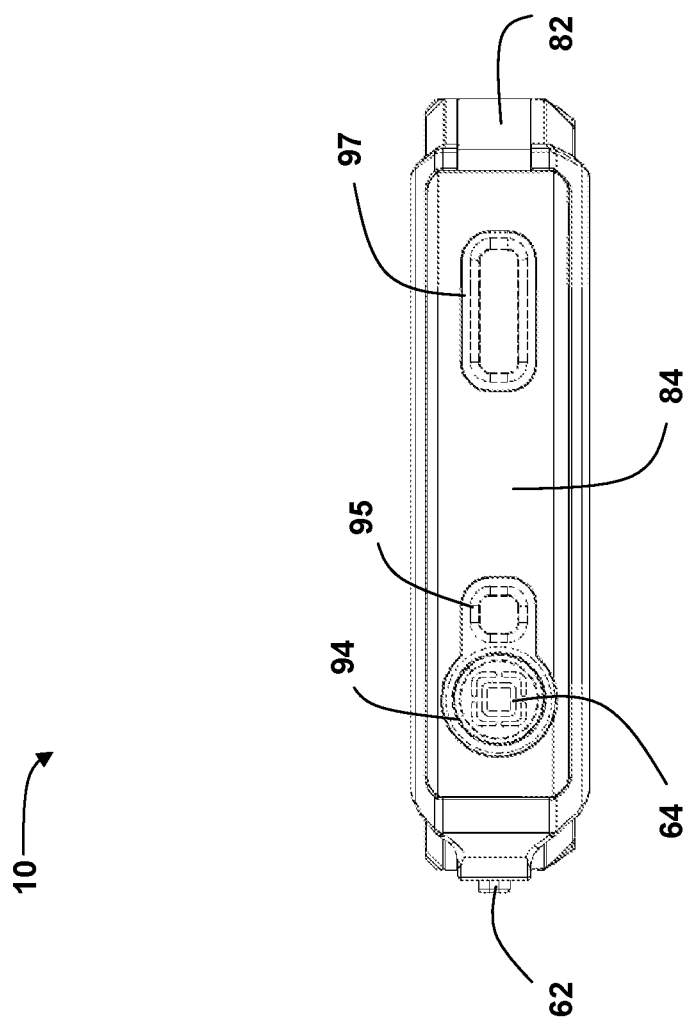
FIG. 3 shows the first and second caps in a closed position of the protective case of FIG. 1.

FIGS. 1-3 are illustrations of an embodiment of a protective case 10 for a mobile device 20. The case 10 can be generally shaped to contain and protect a mobile device (e.g. an iPhone®). When placed inside of a case, the mobile device desirably fits snugly, although the user desirably still has access to the buttons and/or touch screen of the mobile device either directly through apertures in the case 10 or indirectly through other features of the case. In some embodiments, the protective case 10 is configured to reduce or prevent the ingress of undesirable fluids (such as water), dust, or debris into the protective case 10 and onto sensitive components of the mobile device 20 which may be inserted into the protective case 10. In some embodiments, the case is waterproof when in an assembled state.

As best seen in FIGS. 2A-B, the mobile device may have a front surface 22 with a screen located thereon, a back surface 24, and side surfaces extending between the front and back surfaces 22, 24, including a top side 26, a bottom side 32, a right side 30 (as viewed from the display screen 22), and a left side 28. The protective case 10 may include at least two components—a shell 40 which may serve as the primary protection mechanism for the case such that it engages and substantially surrounds multiple surfaces of the mobile device 20 and cap assemblies which may reversibly attach (i.e., engage and disengage) to the shell 40. A cap assembly may provide additional protection for apertures in the shell 40. For example, a first cap assembly 60 having a first cap 64 may be attached to a first hinge 62, which may be reversibly attached to the shell 40 to prevent or allow access to portions of the shell 40 and/or mobile device (FIG. 1). Additionally, in some embodiments, the protective case 10 may include a second cap assembly 80 having a second cap 84 attached to a second hinge 82 which may be reversibly attached to the shell 40 to prevent or allow access to portions of the shell 40 and/or mobile device 20.

As such, as shown in FIG. 1A, when fully assembled the shell 40 of the protective case 10 can engage and substantially surround multiple surfaces of the mobile device 20 to both reduce the likelihood of ingress of fluid into the protective case as well as to provide additional protection to the mobile device 20 from shocks and other potentially harmful forces sustained by the device. In the illustrated embodiment, the shell 40 can engage and substantially surround the mobile device. For example, the shell 40 may engage and substantially surround at least five surfaces of the mobile device.

The shell 40 may itself include two or more components such as a base unit 100 and a back plate 200 as best seen in FIGS. 2A-B. The base unit 100 and back plate 200 may be removably attached from one another, such as by snap fit, to allow the insertion and removal of the mobile device 20 from the protective case 10. In FIGS. 2A-B, the two components of the shell 40—the base unit 100 and the back plate 200—are shown detached from each other. The base unit 100 may include the primary support structure for the protective case 10 and therefore engage and substantially surround a majority of the surfaces of the mobile device, such as surfaces 22, 26, 28, and 30 of the mobile device 20. Since the base unit 100 preferably can engage and substantially surround the front surface 22 of the mobile device 20, the base unit 100 can include a panel 130 to allow a user of the protective case 10 to view contents presented on the screen of the front surface 22. The panel 130 can be light-transmissive and may also allow a user to communicate with a touch screen on the device. The back plate 200, when attached to the base unit 100, is configured to provide a seal for the shell 40 such that fluid ingress is reduced or prevented through the back plate 200.

Components of the base unit 100 and back plate 200 may be co-molded from two or more different materials. In some embodiments, the base unit 100 may be manufactured from two materials. The first material may exhibit at least a slight degree of flexibility and may include polymers such as, but not limited to, thermoplastic polyurethane. The second material may exhibit greater rigidity than the first material and may include polymers such as, but not limited to, polycarbonates. This co-molding of two or more different materials allows for enhanced functional characteristics of the base unit 100 without sacrificing protection against ingress of undesirable fluids. As will be discussed in further detail below, the first material may be used for features of the base unit 100 requiring deformability or flexibility such as buttons and/or hinges. The second material may be used for purely structural components of the base unit 100 such as the frame and plates.

The base unit 100 may include one or more apertures along any side of the base unit 100. The one or more apertures can be configured to allow passage of connection members such as data cable, power cables, headphone jacks, from outside the shell 40 and into the appropriate connectors, jacks, or ports on the mobile device 20. Such apertures may also be configured to allow passage of fluids such as air while reducing or preventing passage of liquids such as water by using selectively-permeable seals. The shell 40 may include any number apertures corresponding to the location of connectors, jacks or ports on the mobile device 20. The illustrated mobile device of FIG. 2A has a headphone jack 34, a microphone 35, a data connector 36, and a speaker 37 along the bottom side surface 32. The shell 40 may have a corresponding headphone aperture 44, microphone aperture 45, data aperture 46, and speaker aperture 47 along a bottom portion of the shell 40.

A cap assembly can be used to cover one or more apertures on the shell 40. A cap assembly may also be used to provide a sealing mechanism for the shell 40 which reduces or prevents the ingress of fluids, dust, or debris into the shell 40. The cap assembly may be free standing or may be attached to the shell 40, such as through a hinge. In addition, the cap assembly can be configured to cover the aperture in one of many different ways. For example, the cap assembly may engage the aperture directly, such as through a friction fit between the cap assembly and the aperture. In other embodiments, the cap assembly may connect to the shell outside of the aperture and may surround the aperture while not directly contacting the aperture.

In some embodiments, the hinge can be an integral of a co-molded shell component having a first material more flexible than the second material. The first material can be used to form the hinge. The flexible material can be sufficiently flexible to allow the hinge and cap assembly to move between two positions, such as an open and closed position.

A first cap assembly 60 may be comprised of a first hinge 62 and a first cap 64 to cover an aperture located on the shell 40 (FIG. 1A). First cap assembly 60 may be used to provide an additional sealing mechanism for the shell 40 which reduces or prevents the ingress of fluids, dust, or debris into the shell 40. First hinge 62 may be a living hinge forming an integral unit with the shell 40, such as the body 160. In some embodiments, the first hinge 62 is formed of a first, flexible material. The flexible material may be one of two materials where one or more components of the shell 40 are formed of two materials, such as being co-molded.

As illustrated in FIG. 2A, two potential embodiments of a first cap, 64 and 64a, are shown which can be attached to the hinge 62. The first cap can attach to the hinge in one of many different ways. First caps 64 and 64a may have annular slots 66 and 66a configured to be received within an aperture 68 on hinge 62. FIGS. 1A-B show the first cap 64 mounted on the hinge 62. The first cap may also or alternatively be glued or welded to the hinge. As shown, first cap 64a has an additional insertion member 65 which may be configured to be received within a connector, jack or port on the phone. In some embodiments, first caps 64 and 64a may be manufactured from different materials which provide more advantageous sealing characteristics such as silicone rubber. In some embodiments, the first cap may be formed with the hinge and may be the same material.

First cap 64 may be retained within the shell 40 via a press fit, friction fit, or interference fit as a result of the elasticity of the material used. In some embodiments, the first cap 64 may be configured to engage and disengage an aperture on the shell 40, such as the headphone aperture 44, the microphone aperture 45, the data aperture 46, or the speaker aperture 47. In such embodiments, the first cap 64 covers an associated connector, jack or port 34, 35, 36, or 37 on the mobile device 20. In some embodiments, the first cap 64 may both cover and engage connectors, jacks or ports on the mobile device 20 such as the headphone jack 34, the microphone 35, the data port 36, or the speaker 37 (FIG. 2A). In the illustrated embodiment, the first cap 64 is configured to be reversibly attached to the headphone aperture 44 thereby covering the headphone jack 34 of the mobile device 20. In some embodiments, the first cap 64 may be used to cover and/or engage one or more ports on the mobile device such as a headphone jack, a power connector, a data connector, speaker, microphone, or any other port on a mobile device.

The protective case 10 may include one or more additional cap assemblies. As shown in FIG. 2A, a second cap assembly 80 may be comprised of a second hinge 82 and a second cap 84 to cover apertures located on the shell 40. Second cap assembly 80 may also be used to provide an additional sealing mechanism for the shell 40 which reduces the likelihood, or prevents, ingress of fluids, dust, or debris into the shell 40. Second hinge 82 may be a living hinge forming an integral unit with the shell 40. In some embodiments, the second hinge 82 is formed of a first, flexible material. The flexible material may be one of two materials where one or more components of the shell 40 are formed of two materials, such as being co-molded. Second cap 84 may be attached to the second hinge 82 via attachment mechanisms such as a press fit, co-molding, adhesive, ultrasonic welding, or any other attachment mechanism known in the art. In some embodiments, second cap 84 may be manufactured from materials providing greater rigidity such as polycarbonates. In some embodiments, the second cap 84 may be manufactured from the same material as the first or second material of the shell.

The second cap 84 may removably attach to the shell 40 or an aperture on the shell via a friction fit, snap fit, or any other attachment mechanism known in the art. In reviewing FIGS. 1A-B and 3, it can be seen that the second cap 84 can engage and attach to the front plate 120 and the back plate 200 of the shell 40. Thus, the second cap 84 can be larger than the end of the shell and the bottom of the shell, and may fit over the end. The front plate 120 and/or back plate 200 can include one or more dimples 48 (FIG. 1A). The second cap 84 can have a corresponding one or more small protrusions 50 (FIG. 1B) that can fit in the one or more dimples 48. When a dimple 48 and protrusion 50 are moved to an engaged position the user may hear an audible click or snap. This can indicate to the user that the second cap 84 is properly closed. It will be understood that in some embodiments, the dimple is on the second cap 84 and the protrusion is on the shell 40.

Second cap 84 may additionally include apertures along its surface to allow access to the associated apertures or features on the shell 40 and/or mobile device. In some embodiments, the second cap 84 may include a headphone aperture 94, a microphone aperture 95, and a speaker aperture 97. The second cap 84 may include additional apertures for apertures on the shell 40 allowing access to power connectors, data connectors, and any other connector located on the mobile device 20. The second cap 80 may also include gaskets configured to provide additional seals for apertures located on the shell 40. As such, second cap 80 may be configured to cover connectors, jacks and/or ports such as headphone jacks, power connectors, data connectors, speakers, and microphones on the mobile device 20.

In some embodiments, a protective case for a mobile device can comprise a shell configured to engage and substantially surround at least three surfaces of the mobile device. The shell can comprise a first material co-molded with a second material, the first material being flexible and the second material being harder than the first material. A first cap can be configured to engage and disengage with the shell to thereby prevent or allow access to a portion of the mobile device. A first hinge can extend from the shell and connect the first cap and the shell. The first hinge can comprise the first material and be configured to permit the first cap to move between an engaged position and a disengaged position with the shell. The first cap can be configured to cover at least one of a headphone jack, a power connector, a data connector, speaker, and a microphone on the mobile device.

The protective case can also include a second cap configured to engage and disengage with the shell to thereby prevent or allow access to a portion of the mobile device.

The second cap can be connected to the shell via a second hinge extending from the shell. The second hinge can be made of the first material and be configured to permit the second cap to move between an engaged position and a disengaged position with the shell.

In some embodiments, a protective case for a mobile device can include a shell configured to engage and substantially surround at least two, three, four, five, or six of the surfaces of the mobile device. The shell can comprise a first headphone jack hole configured to allow a headphone connector to pass through the shell and connect to a headphone jack on the mobile device. A headphone jack cover can move between an engaged position and a disengaged position wherein the headphone jack cover is respectively engaged or disengaged with the shell at the headphone jack hole to thereby prevent or allow access to the first headphone jack hole. A cap can be configured to move between an engaged position and a disengaged position wherein the cap is respectively engaged or disengaged with the shell wherein the cap is also configured such that when the headphone jack cover is in its engaged position, movement of the cap between its engaged and disengaged position the cap also engages and disengages with the headphone jack cover. The cap can comprise a second headphone jack hole configured to allow a headphone connector to pass through the cap to the first headphone jack hole and to connect to a headphone jack on the mobile device when the headphone jack cover is in its disengaged position and the cap is in its engaged position.

In a fully closed or engaged position, the first cap 64 may be engaged with an aperture 44 on the shell 40. Second cap assembly 80 may then be engaged with the shell 40 and with the first cap 64a, 64b. As a non-limiting example, the first cap 64 may be engaged to both the headphone aperture 44 of the shell 40 and the headphone aperture 94 of the second cap 80, as can partially be seen in FIG. 3.

This feature of having the first cap 64 under the second cap 80 can provide a beneficial an extra safety feature. In some embodiments, the protective case 10 may also have "fail-safe" functionalities to ensure that a user is aware of whether or not the protective case 10 is fully protected against unwanted ingress or not. In some embodiments, the second cap assembly 80 may be configured to be incapable of properly engaging the shell 40 in a closed position if the first cap assembly 60 is neither in a fully closed nor in a fully open position with respect to the shell 40. As such, the second cap assembly 80 may be prevented from engaging the shell 40 when the first cap assembly 60 is improperly engaged with or misaligned within an aperture on the shell 40. This "fail-safe" mechanism reduces the likelihood that a user of the protective case 10 will unknowingly improperly close the protective case 10 and potentially cause damage to the mobile device 20 due to ingress of liquids, dust, or debris.

For example, in some embodiments, when the second cap assembly 80 engages with the shell 40 in a closed position, the user can hear an audible click or snap. In some embodiments, the user may be able to visually see that the second cap is closed because, for example, its position matches or is parallel to features on the shell itself. When the first cap 64 is close to its closed position, but not properly engaged with the shell and/or aperture, the second cap can be prevented from closing. This may mean that the user will not hear the audible click, or that the second cap will not be aligned with features on the shell. This, the user can know that the second cap is not properly closed.

Having hinged caps also provides the benefit of maintaining the caps on the case. Thus, they cannot be lost unless they are broken off the case itself. The hinges may also allow the caps to be moved fully out of the way when not in use.

In some embodiments, the first cap can be in an open position while the second cap is in the closed position. This can allow a user to connect a pair of headphones or a headset to the mobile device without removing the mobile device from the case. In some embodiments, the headphone jack can engage the case in such a way to maintain the case in a sealed or substantially sealed condition.

As shown in both FIGS. 2 and 3, which are perspective views of the protective case 10, the shell 40 may be comprised of both a base unit 100 and a back plate 200. The base unit 100 and the back plate 200 may be configured such that they may be reversibly attached from each other. In such arrangements, the mobile device 20 may be inserted into either the base unit 100 or the back plate 200 while the two components of the shell 40 are separated.

The shell 40 may include features which allow the mobile device 20 to be suspended or partially suspended within the case. As has been mentioned, the shell, including the base unit 100, may be formed of two materials, such as by co-molding. In some embodiments, a suspension system can be co-molded into the case. For example, the base unit 100 may suspend the sides of mobile device. The softer material can be formed into ribs within the shell configured to suspend the mobile device within the case 10. As another example, as will be discussed in more detail below with respect to FIGS. 8-10, the back plate 200 may have raised sides 204 on the surface 206 facing the mobile device. Thus, the back of the mobile device may be substantially suspended from the rest of the back plate 200.

With reference to FIGS. 2A-B the base unit 100 is shown with a middle frame 160 that has been co-molded of two separate materials 180, 162. The first material 180 may exhibit at least a slight degree of flexibility and may include polymers such as, but not limited to, thermoplastic polyurethane. The second material 162 may exhibit greater rigidity than the first material 180 and may include polymers such as, but not limited to, polycarbonates. The first material 180 may be used for features of the base unit 100 requiring deformability or flexibility such as buttons and/or hinges and may be sufficiently flexible to allow movement between two or more positions. The second material 162 may provide the base structural support. The second material can be sufficiently hard to protect the mobile device from impact, such as drops and strikes. For example, the harder material should be able to withstand and protect the mobile device from being hit against a sharp edge or corner of a table, as well as, from being dropped by a user. As has been discussed, the first and second hinges 62, 82 may be formed of the first, flexible material 180.

Figure 4A:
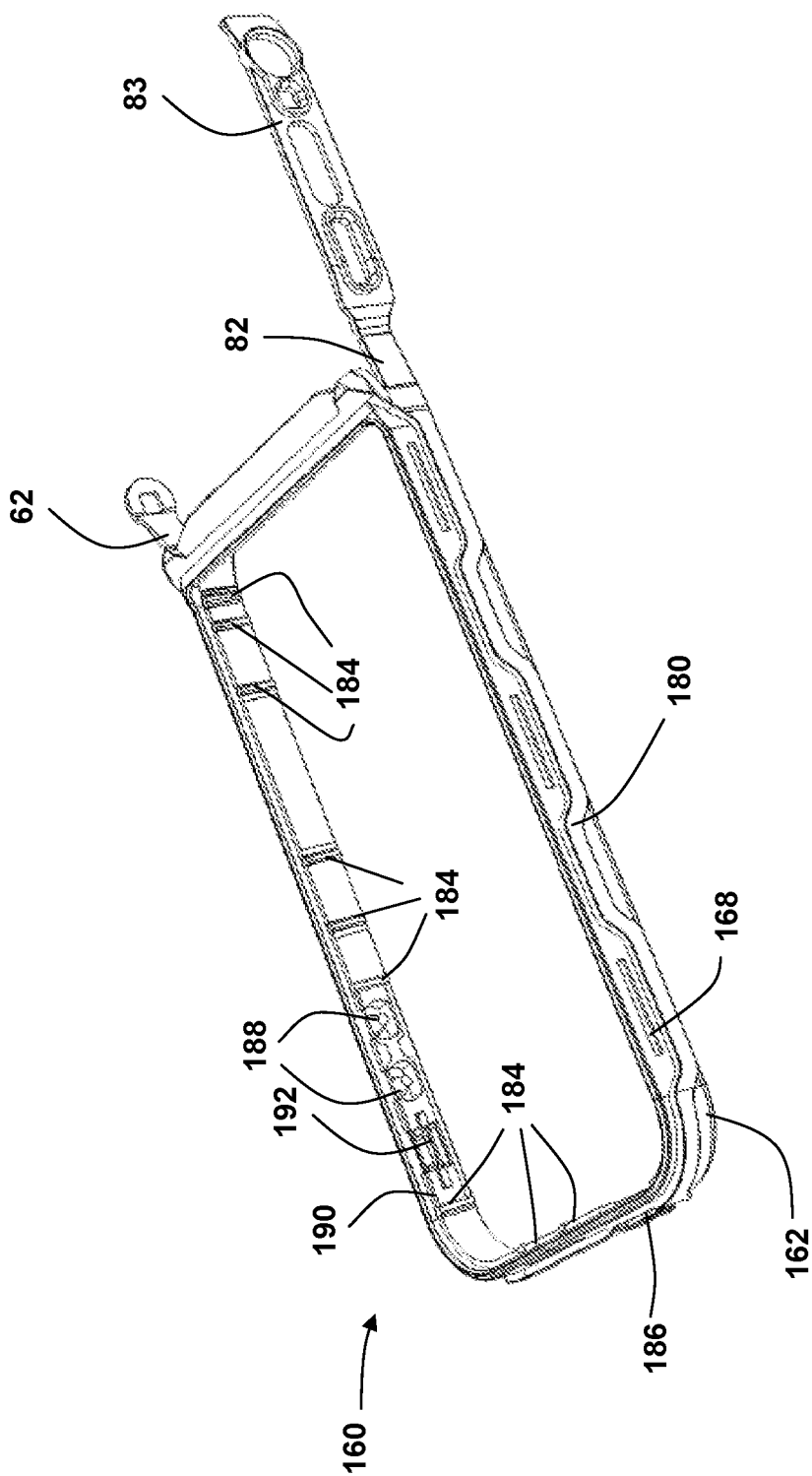
FIGS. 4A-B illustrate the components of the middle frame of the protective case of FIG. 1.
Figure 4B:
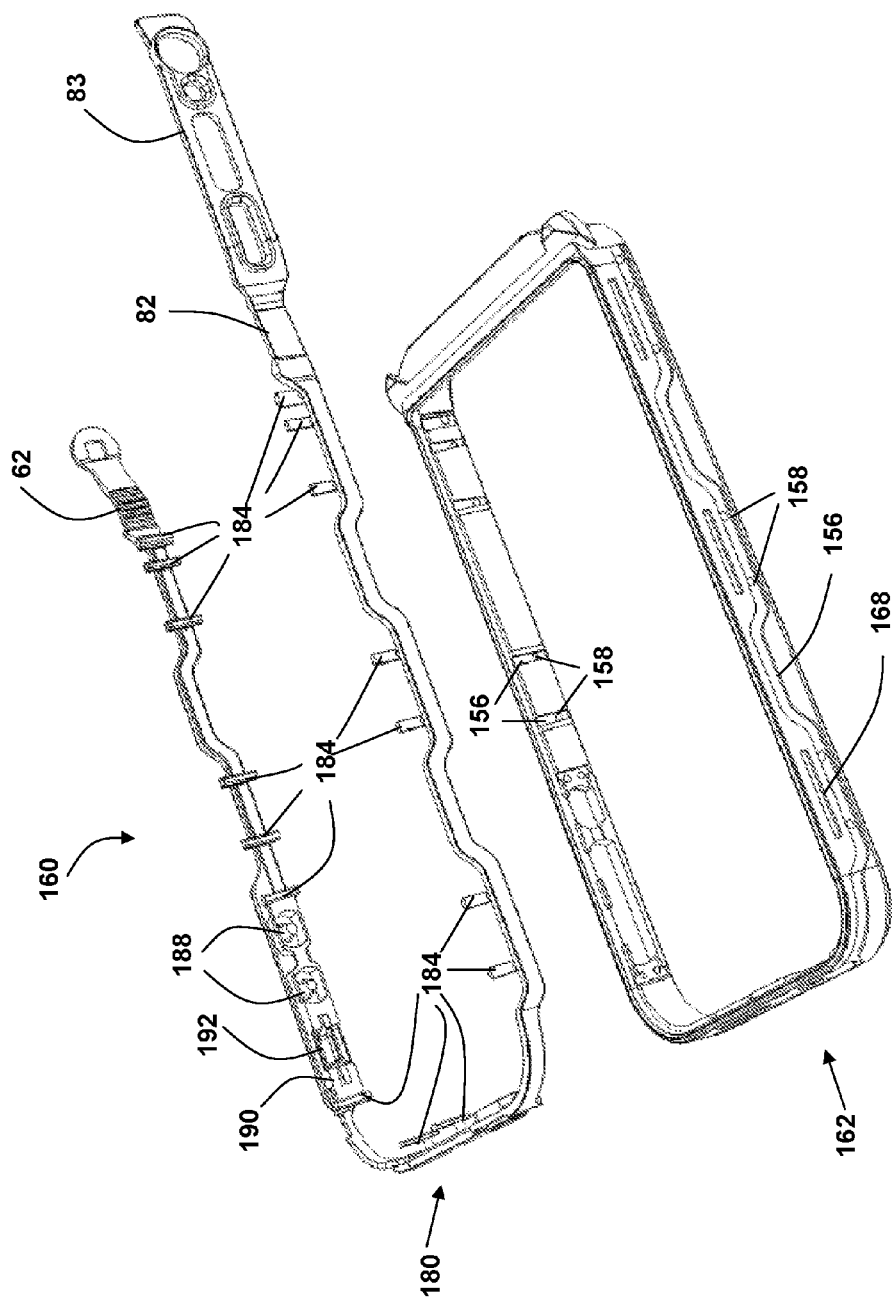

Turning now to FIGS. 4A-B, the middle frame 160 is shown. In FIG. 4A the middle frame is shown as it could appear after the co-molding process with both materials 162, 180 joined together to form the middle frame 160. FIG. 4B is for illustration purposes only and shows the two materials separately. It should be understood that the middle frame 160 would not exist as two separate components. Rather, typically the second harder material 162 would be molded into the desired shape, such as by injection molding and then the first material would be molded into and onto the second material, such as by over molding, to form the co-molded middle frame 160. Thus, the co-molded material can be a unitary or single unit that does not separate under normal conditions.

The second material can form a body 162. The body 162 may be configured to provide structural support for the shell 40. The body 162 may be manufactured from materials that may exhibit greater rigidity than other materials used on the device and may include polymers, such as, but not limited to, polycarbonates, as well as other similar materials.

The body 162 may include a number of apertures that may correspond to features such as connectors, jacks, buttons or ports on the mobile device 20. These apertures may be provided to allow access to the feature in the assemble case 10, or these apertures can be configured to receive the first material 180. As the first material 180 is more flexible than the second material, it can advantageously be used to form buttons, seals, hinges, etc. For example, the body 162 may include a volume/mute aperture 166 along one side of the body. The body 162 may also include one or more channel 156 and/or channel 158 configured to receive the first material 180. The body 162 may additionally include retention receivers 168 configured to receive an attachment mechanism located on the back plate 200.

As has been mentioned, the first material 180 can be different from and more flexible than the second material used for the base 162. In some embodiments, the first material 180 may be manufactured from materials exhibiting a greater degree of flexibility compared to other materials used for the shell 40. This may include polymers such as, but not limited to, thermoplastic polyurethane, as well as other similar materials. The first material can be co-molded with the body 162 to form the middle frame 160.

As illustrated, the first material 180 is formed as a continuous elongate strip. It will be understood that the first material 180 could be attached to the base at one or more discreet locations that are not connected. For example, the first material 180 can be co-molded with the middle frame 160 in three different parts, corresponding with the top and two sides of the middle frame 160. Having the hinges 62, 82 attached to a larger piece of material can beneficially increase the life of the hinges. It will be understood that the hinges will likely see a lot of use and so having the hinges on a larger piece of material co-molded to the body 162 can help prevent pealing, premature breakage, and/or separation of the hinge from the body 162.

As shown, the first material 180 includes first hinge 62 and second hinge 82. In some embodiments, second hinge 82 has an attachment strip 83 that can be used to attach to the second cap 84. In such embodiments, the second cap 84 may be attached to the second hinge 82 by placing the elongate strip 83 within the second cap 84. The attachment strip 83 can be shaped and dimensioned to correspond to the second cap 84.

The first material 180 may also be used to form buttons and/or rockers on the middle frame 160. The buttons and/or rockers can allow a user to activate switches located on the mobile device such as a power switches, volume switches, mute switches, hold switches, lock switches, and other similar types of switches used on a device. As such, the first material may form a power button 186, volume buttons 188, and a mute rocker switch 192. In some embodiments, one or more button or switch can be located on a button panel 190.

The first material 180 may also form internal ribs 184 which may be configured protrude within the body 160. The internal ribs 184 can be used to suspend the mobile device 20 from the body 162 when a mobile device 20 is placed within the case.

The internal ribs 184 can be vertically extending thin bands when the case is laying face down as shown in FIGS. 4A-B. The internal ribs 184 can be placed on one or more internal sides of the middle frame 160. For example, as shown the internal ribs are positioned around the top and the two sides. The internal ribs 184 may correspond in thickness to the channels 156. The channels for the internal ribs 184 can be thin grooves in the second material 180. The internal ribs 184 can be grouped in pairs or threesomes. In addition, the internal ribs 184 may extend from other parts of the first material. For example, the internal ribs 184 may extend from a button, switch or a button panel 190. As shown, an internal rib 184 extends from either side of the button panel 190.

The internal ribs 184 have a height, width, and depth. In some embodiments, the height can be measured as extending from the front face 120 to the back 200. The depth can be measured as extending inward from the body 162 towards the interior volume. The width can be measured along the body 162, for example from the top to the bottom or from side to side, depending on where the internal rib is located. In some embodiments the height of the internal ribs is at least 80 percent of the distance between the front edge and back edge of the body 162. In some embodiments, the width of the internal ribs is smaller than their height.

In some embodiments, a protective case can include a plurality of internal ribs along an internal surface of the case. The internal surface can surround at least the top, bottom and two sides of the mobile device. The ribs can be preferably located on at least three of the surfaces, such as along the top and the two sides. The ribs may be the furthest inward projecting structures along those surfaces that contact the mobile device apart from buttons or switches on the case. These ribs can be substantially thin as compared to their height. For example, they can have a width less than ½, ⅓, ¼, or even smaller than their height.

As the case can be configured to be tight fitting, a plurality of thin ribs can beneficially suspend the mobile device within the case to better protect the mobile device, but can also provide many locations to be able to engage the mobile device with one's fingers to remove the mobile device from the case. In many current devices that offer some degree of water protection, it can be extremely difficult to remove the mobile device from the case. If there is cushioning in the case, it is often large blocks of cushioning which may provide certain benefits but can make removal of the mobile device very difficult. In addition to providing many locations for the fingers to engage the mobile device the plurality of ribs can also prevent sticking and/or capillary action that may otherwise occur within a watertight case that may make removal of the mobile device difficult.

Figure 5:
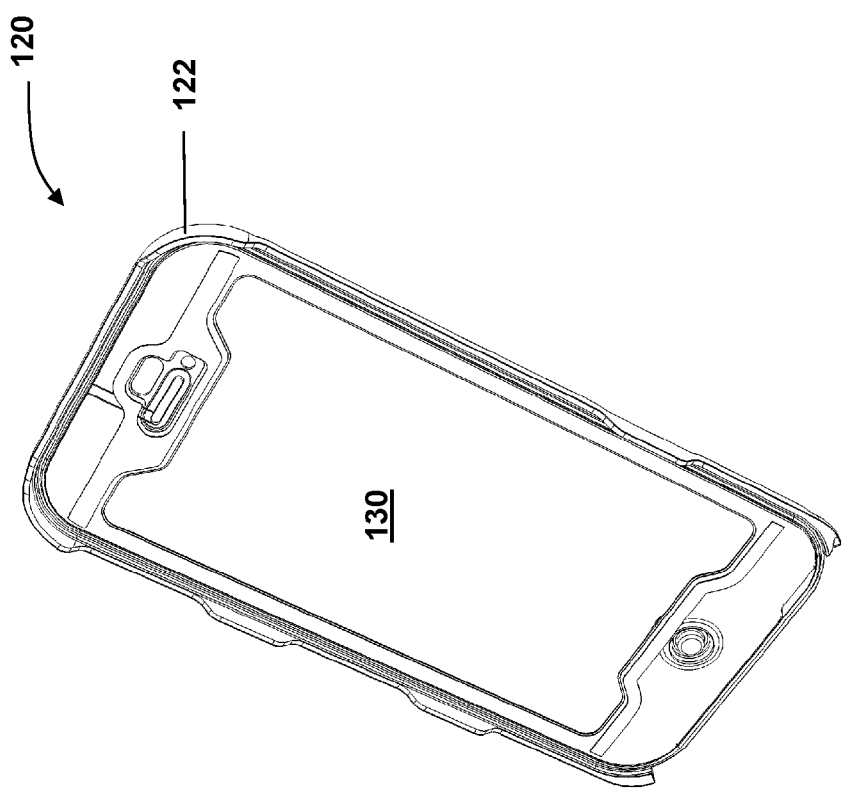
FIG. 5 is a perspective interior view of an embodiment of a front plate of the base unit of FIG. 1.
Figure 6:
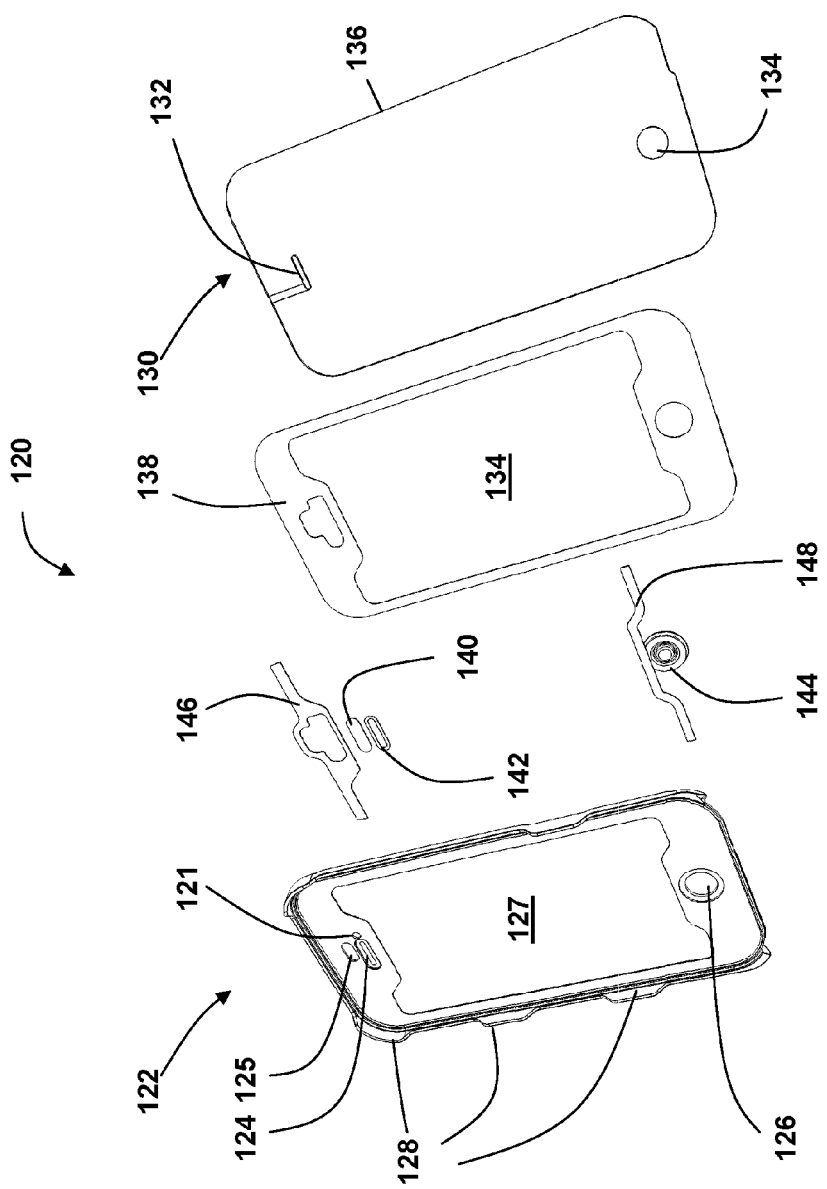
FIG. 6 is an exploded view of the front plate of FIG. 5.

Returning now to FIGS. 1A-2B, it can be seen that a front plate 120, including the panel 130 can be connected to the middle frame 160. The front plate 120 can be attached to the middle frame 160 using various attachment mechanisms such as adhesives, welding, or any other attachment mechanism known in the art. In one example, middle frame 160 is ultrasonically welded to the front plate 120. FIGS. 5-6 show further details of the front plate 120.

The front plate 120 may be comprised of multiple components including a front frame 122 and in some embodiments a panel 130, such as a light-transmissive panel. The outermost (i.e., front-most) component may be a front frame 122 having apertures corresponding to functional components, speakers, microphones, cameras, screen (LCD screen, touch screen, etc.), connectors, ports, or jacks on the front surface 22 of the mobile device 20. As shown in FIG. 6, the front frame 122 has a microphone aperture 121, a speaker aperture 124, a camera aperture 125, a button aperture 126, and a screen aperture 127. Other apertures may be included depending upon the mobile device 20. Such apertures may be included to provide access to these functional components, connectors, ports or jacks while the mobile device 20 is engaged and with the front plate 120. The front panel 122 may additionally include raised protrusions 128 which extend from the front plate 122 in perpendicular to the front surface. Such protrusions 128 may be configured to contact and abut the middle frame 160 of the base unit 100 when fully attached.

As the front frame 122 may be configured to provide structural support for the shell 40 and the attached components of the front plate 120, the front frame 122 may be manufactured from materials that exhibit greater rigidity than certain other materials used on the device and may include polymers, such as, but not limited to, polycarbonates, as well as other materials such as metals and rubbers with a high shore rating.

The front plate 120 may include a panel 130, such as a light-transmissive panel which includes apertures for functional components, speakers, microphones, cameras, connectors, ports, or jacks on the front surface 22 of the mobile device 20 such as a speaker aperture 132 and a button aperture 134. Other apertures may be included depending on the mobile device 20. Such apertures may be included to provide access to these functional components, connectors, ports or jacks while the mobile device 20 is engaged and with the front plate 120. The light-transmissive panel 130 may additionally include a panel gasket 136 located around its perimeter edges to provide a more advantageous seal against the ingress of fluid, such as water, into the front plate 120. As such, panel gasket 136 may be made of materials providing advantageous sealing characteristics such as rubbers with a low shore rating and silicone rubber.

Light-transmissive panel 130 may be dimensioned to snugly fit within the front frame 122 and may be manufactured of any type of light-transmissive material such as glasses or plastics. Additionally, in some embodiments, the material may also be electrically conductive such that the functionality of a touch screen, such as resistive or capacitive touch screens, would not be substantially affected. In some embodiments, the light-transmissive panel 130 may be made of tempered glass. The light-transmissive panel 130 may be attached to the front frame 122 via an adhesive 138, by welding, or any other attachment mechanism known in the art.

Preferably, the panel 130 is made of glass. Having a glass panel can provide the case 10 with many benefits. For example, glass is much more resistant to scratching than is plastic. In addition, glass generally does not create bubbles or create distortion in ways that plastic might. Still further, glass is also not as susceptible to deterioration, fading, discoloration as many plastics. Glass can be made very thin and can also be extremely strong.

Front plate 120 may include a button 144 configured to fit within button apertures 126 and 134 of the front plate 120 and the light-transmissive panel 130 respectively. The button 144 may be made of materials having advantageous sealing characteristics while also being relatively deformable. Such materials may include soft polymers such as rubber with a low shore hardness and softer plastics. In some embodiments, the button 144 may be made of materials such as silicone rubber. The button may be attached directly to the front frame 122 via adhesives, overmolding, welding, or any other attachment mechanism known in the art.

Front plate 120 may additionally include suspension members 146 and 148 which can be attached to an interior surface of the light-transmissive panel 130 such that the front surface 22 of a mobile device 20 can be slightly elevated from the light-transmissive panel 130. Such elevation from the light-transmissive panel 130 may reduce the likelihood of damage to the front surface 22 based on reduced contact with the front surface 22. The amount of elevation may be chosen such that contact can still be made between the light-transmissive panel 130 and the front surface 22 when pressure is applied to the light-transmissive panel 130. In some embodiments, the suspension members 146 and 148 can comprise a fabric material such as felt.

Front plate 120 may also include one or more membranes that can be used to seal off the front plate from unwanted liquid, dust, or debris while allowing sound or other transmissions to pass through the membrane. For example, a selectively-permeable seal 140 with a gasket 142 can be configured to cover an aperture of the front plate 120. The selectively-permeable seal 140 may be configured to either reduce or prevent the passage of certain fluids, such as water, through the seal. As such, the selectively-permeable seal 140 may advantageously protect a mobile device 20 from ingress of harmful fluids such as water while providing relatively unhindered functionality for microphones and speakers. Selectively-permeable seal 140 may be manufactured from any type of material allowing for selective-permeability such as, but not limited to, polyethylene terephthalate (PET), and polytetrafluoroethylene (PTFE) or other fluoropolymer products such as GORE-TEX. In some embodiments, the materials used for selectively-permeable seal 140 may differ from materials used for selectively-permeable seals used on other parts of the shell 40.

In some embodiments, the selective-permeability seal 140 can comprise a layered membrane 140. In some embodiments the layered membrane seal 140 can comprise a first layer of PTFE, a second layer being a PET spacer and a third layer of a metal mesh. In other embodiments the layered membrane 140 can comprise a first layer of PTFE and a second layer of a nylon-like mesh.

The gasket 142 for the selectively permeable seal 140 may be placed between the seal 140 and the component upon which it is attached to provide an additional sealing mechanism against fluid ingress. In some embodiments, the selectively-permeable seal 140 may be placed between the front frame 122 and the light-transmissive panel 130 such that the selectively-permeable seal 140 covers the speaker apertures 124, 132. The seal 140 may also cover the microphone aperture 121. In some embodiments, because of the proximity of the speaker and microphone, only one seal may be needed in the vicinity of the speaker and/or microphone.

In some embodiments, the selective-permeability seal 140 can be a flexible membrane to not only allow the passage of sound, but also to adjust for pressure changes inside the case. It will be understood that when the panel 130 is glass, and the rest of the shell is primarily plastic, there may not be much room for the case, or the glass to expand, or otherwise deal with pressure differences between the case and the surroundings. The selective-permeability seal can be flexible to allow for expansion or movement of the seal as a way to deal with the pressure changes. In addition, the seal 140 and gasket 142 can also be formed to allow for compression and/or expansion of the gasket with the seal 140 to balance pressure differences. As, shown in FIG. 6, the gasket 142 can be received in a depression in the front frame 122 around the aperture 124. The seal can be attached to the gasket and can being contact with the glass panel 130. One or more of the gasket and seal can move, flex, expand, and/or compress as pressure differences are experienced between the case and the atmosphere.

Figure 7:
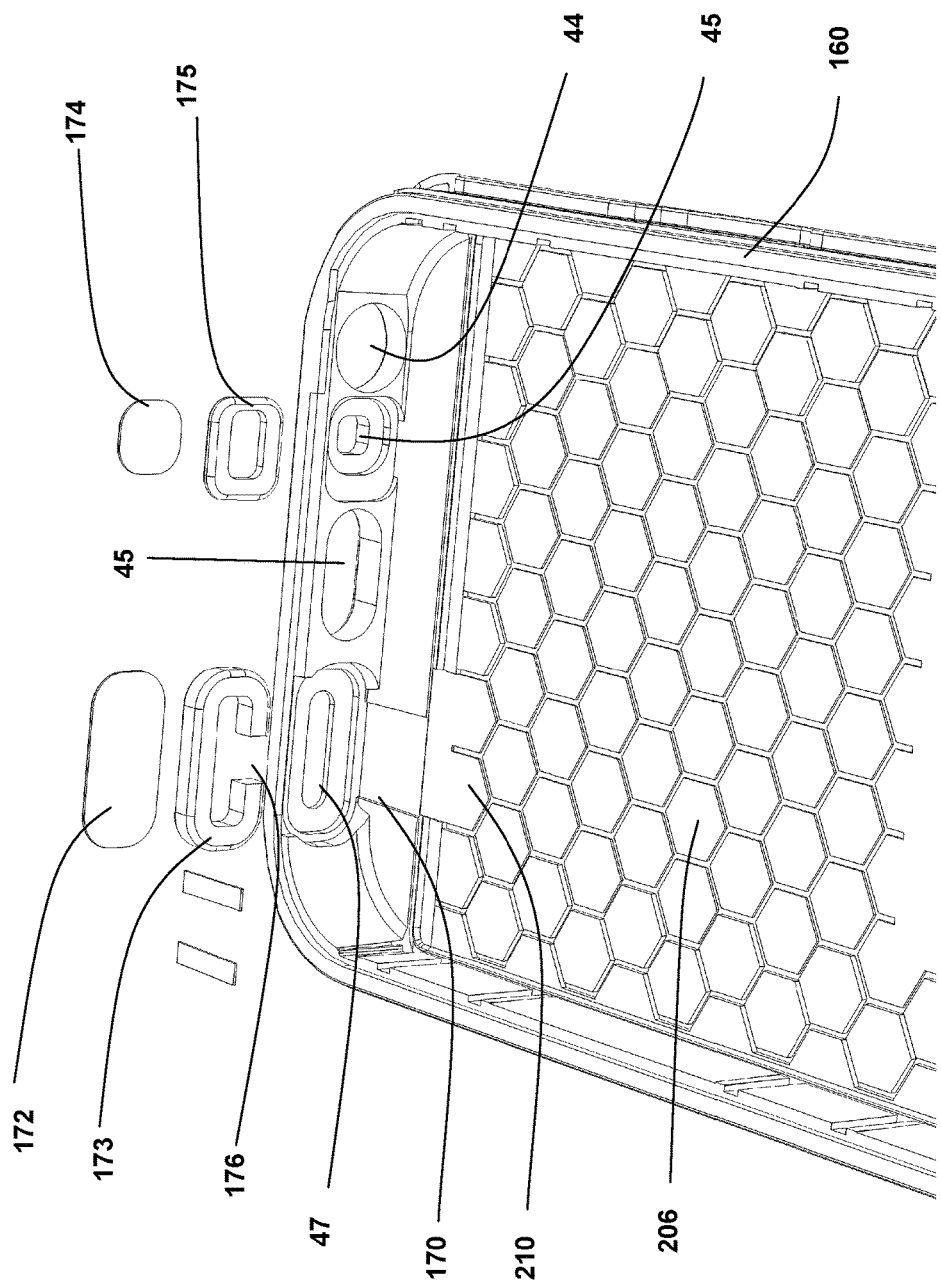
FIG. 7 is a partial exploded view of the protective case of FIG. 1 without the front plate.

Moving now to FIG. 7, additional selectively-permeable seals or layered membranes are shown. The mobile device may include multiple speakers and/or microphones that may located at various locations on the device. Thus, the case can include apertures and membranes on any of its surfaces to correspond to one or more of the speakers and/or microphones. In some embodiments the layered membranes may be the same for all of the components, but they may also be different. For example a layered membrane for a speaker at the bottom of the case may be different than a layered membrane for a speaker at the top of the case, similarly, for a microphone. In some embodiments, the layered membrane can be different depending on whether it is used for a speaker or a microphone.

As shown in FIG. 7, the middle frame 160 (shown without the second material 180 for ease of illustration) may have apertures corresponding to connectors, ports, jacks, buttons, or any other functional component on the exterior of the mobile device 20 which allow access to these functional components. Middle frame 160 may also include a selectively-permeable seal 172 and gasket 173 configured to cover one of the apertures, such as a speaker aperture 47. Middle frame 160 may also include a selectively-permeable seal 174 and gasket 175 configured to cover a second one of the apertures, such as a microphone aperture 45. Such selectively-permeable seals 172 and 174 may be configured to either reduce or prevent the passage of certain fluids, such as water, through the seal while still allowing other fluids, such as air, to pass with little to no restriction through the seals 172 and 174. As such, the selectively-permeable seal 172 and 174 may advantageously protect a mobile device 20 from ingress of harmful fluids, dust, or debris while providing relatively unhindered functionality for microphones and speakers.

Selectively-permeable seals 172 and 174 may be manufactured from any type of material allowing for selective-permeability such as, but not limited to, polyethylene terephthalate (PET), and polytetrafluoroethylene (PTFE) or other fluoropolymer products such as GORE-TEX. In some embodiments, the materials used for selectively-permeable seal may differ from materials used for selectively-permeable seals used on other parts of the shell 40. In some embodiments the selective-permeability seal is a layered membrane and can comprise a first layer of PTFE, a second layer of a PET spacer and a third layer of a metal mesh. In other embodiments the selective-permeability seal 140 can comprise a first layer of PTFE and a second layer of a nylon-like mesh. Seals 172, 174 and 140 may be manufactured from different materials. In some embodiments, seals 172 and 140, which are both used to cover speaker apertures, may be manufactured from the same materials.

In some embodiments, the seal 172 for the speaker is made from a first layer of PTFE and a second layer of nylon like mesh and the seal 140 for the speaker is made from a first layer of PTFE, a second layer of a PET spacer and a third layer of a metal mesh. In some embodiments, the seal 174 for the microphone is made from a first layer of PTFE, a second layer of a PET spacer and a third layer of a metal mesh.

Figure 8:
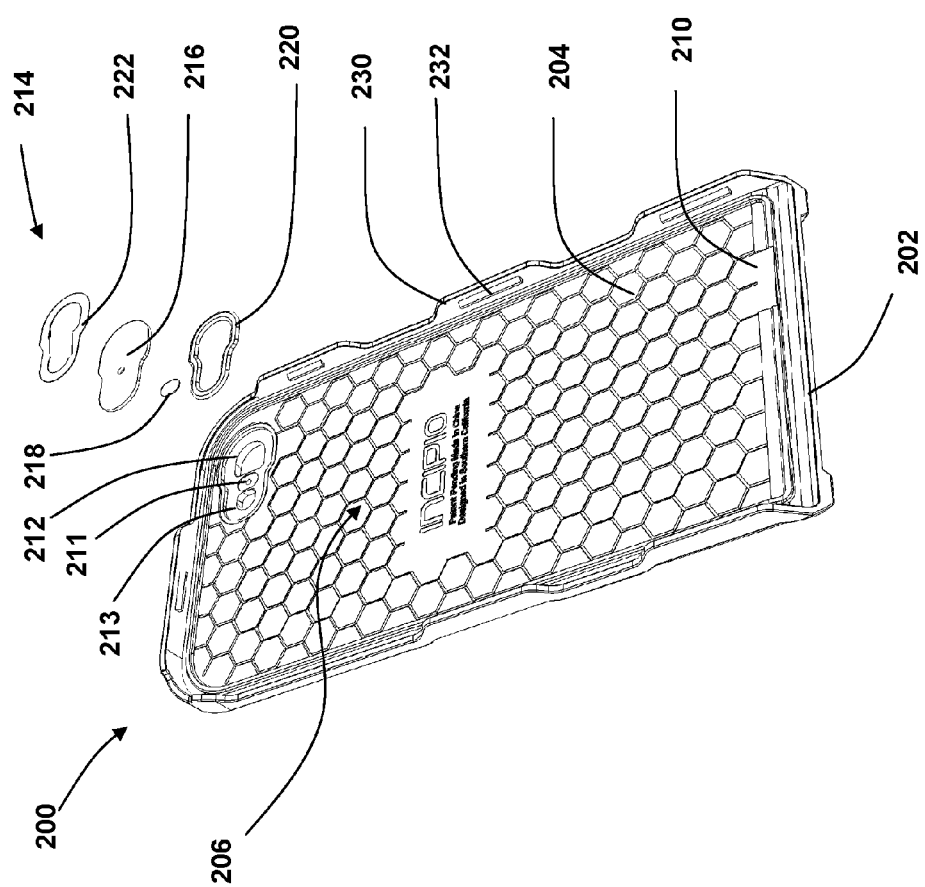
FIG. 8 is an exploded view of the back plate of the protective case of FIG. 1.

The back of the mobile device may include a speaker and/or microphone. Thus, the back plate 200 may also include one or more selectively-permeable seals 218 as shown in FIG. 8. In some embodiments, the seal 218 for the microphone is made from a first layer of PTFE and a second layer of nylon like mesh, though other materials can be used as will be understood.

The back plate 200 may also include assemblies to allow access through the case of certain functional components located on a back surface of the mobile device 20. The back plate 200 may include a camera aperture 212, a flash aperture 213, and a microphone aperture 211. It may also include a corresponding camera panel assembly 214. These apertures may be sized and shaped to allow access to a camera, a flash component, and a microphone located on the back surface 24 of the mobile device. The camera panel assembly 214 may be comprised of a light-transmissive panel 216, a selectively-permeable seal 218, a gasket 220, and adhesive material 222. The selectively-permeable seal 218 may be used to cover a microphone located on the back surface 24 of the mobile device as has been described.

According to some embodiments, the camera panel assembly 214 can be attached to the back plate 200 in the following order. The selectively-permeable seal 218 can first be placed over the microphone aperture 211. This can be followed by the adhesive and then the light-transmissive panel 216 can be placed over all three apertures 211, 212, 213. Finally a gasket 220 can be attached to the light-transmissive panel 216.

The gasket 220 can engage with the back 24 of the mobile device. By having a gasket around the microphone on the back of the mobile device an echo can be prevented from occurring. Thus, the microphone can be acoustically isolated from the rest of the insides of the case. For example, the microphone can be acoustically isolated from sound from the speakers on the mobile device that is being transmitted within the case. Of course, sound outside of the case, including from the speaker of the mobile device may still reach the microphone.

In some embodiments, a protective case can include a hole passing through the case that is configured to be positioned near a microphone of the mobile device. The case can include a gasket surrounding the hole being raised from the inside surface of the case to engage the mobile device and to form a sealed enclosure around the hole to acoustically isolate the sealed enclosure from the rest of the insides of the case. In some embodiments, the gasket 220 can be a rubber gasket. In some embodiments, a membrane can cover the hole.

In other embodiments, the gasket can be used to seal the case to prevent the inflow of liquid, dust or debris from entering the case, but can allow sound to travel through the gasket. For example, the gasket 220 can be a relatively thin gasket. In some embodiments, the gasket can be made of foam and can be substantially the same or only slight taller than the back surface.

Figure 9:
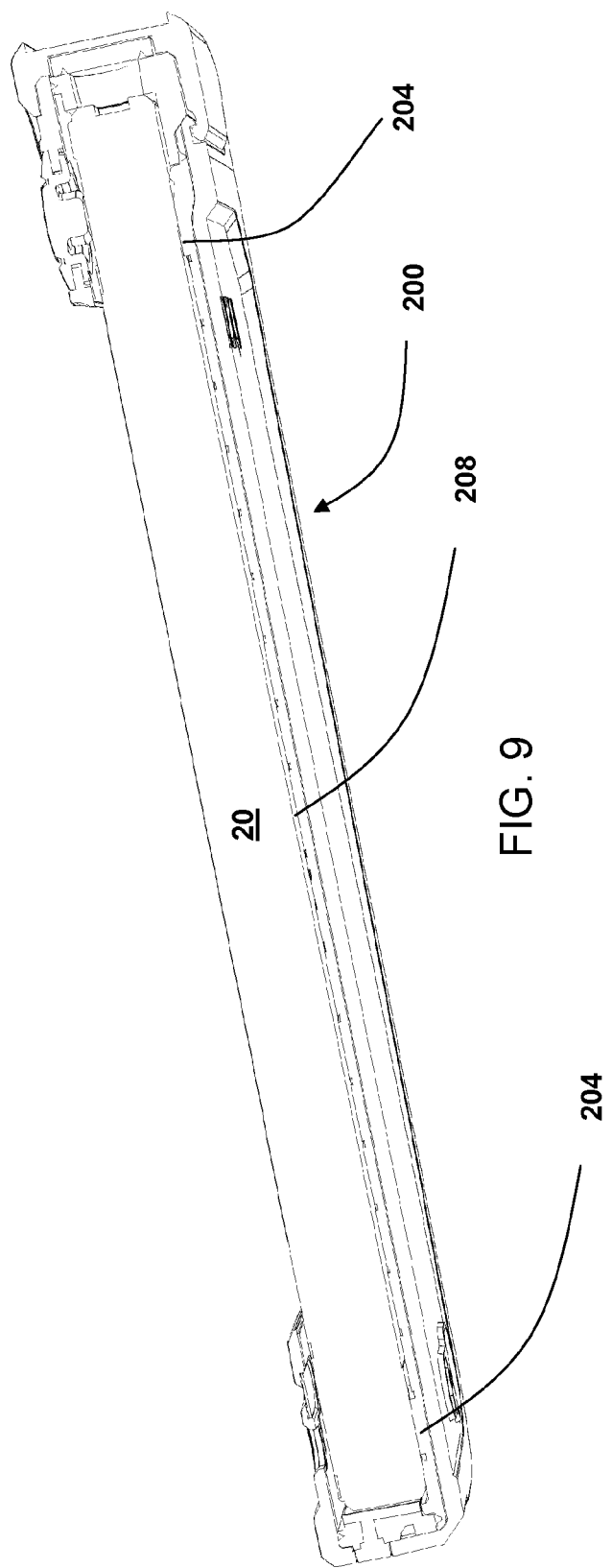
FIG. 9 is a sectional view of the protective case and mobile device of FIG. 1A taken along line 9-9.

The back plate 200 may have raised sides 204 on the surface 206 facing the mobile device. Thus, the back of the mobile device may be substantially suspended from the rest of the back plate 200. In addition, this can create a volume 208 between the back of the mobile device and the back plate as can be seen in FIG. 9. FIG. 9 is a cross-sectional view of section 9-9 (as shown in FIG. 1A).

With reference back to FIGS. 7-8, the surface 206 may also include a recessed portion 210, such that, when a mobile device 20 is adjacent to and engaged with the surface 206, including the raised sides 204, the interior chamber 208 can be in fluid communication with a bottom side of the shell 40. The middle frame 160 may include a corresponding channel 170. In such embodiments, this configuration may allow fluid communication from the interior chamber 208, to the recessed portion 210, to the channel 170, and out of selectively-permeable seal 172 due to a void 176 located along the perimeter of the gasket 173. This may also allow communication between a speaker on the mobile device located near the aperture 47 and a microphone on the back of the mobile device. Such communication can allow for noise cancelling features of the mobile device to perform without inhibition. It has been found that allowing some communication within a case between a speaker and microphone used for noise cancellation can help ensure that the noise cancellation features of the mobile device function properly.

The location of the interior chamber 208 may be chosen to correspond to functional features which may be present on the back surface 24, or on other surfaces of the mobile device 20. The interior chamber 208 may be configured to allow such functional features to properly operate.

The surface 206 may be manufactured from materials suitable for creating a seal such as polymers such as soft plastics and rubbers with a low shore rating. In some embodiments, silicone rubber may be used.

Back plate 200 may additionally comprise raised protrusions 230 extending in a direction perpendicular to the panel 202. These raised protrusions may include retention mechanisms 232, such as clips or wings, which are configured to be received within retention receivers 168 of the middle frame 160 for attaching the back plate 200 to the base unit 100.

The inventors here recognize that electronic devices have been or will increasingly be equipped with biometric sensors that serve as security mechanisms to verify the identity of the user and facilitate access to the electronic device. For example, it is contemplated that mobile devices such as cellular and smart phones, lap tops, and tablets, and the like, etc. will increasingly employ personal identification and verification biometric sensors as a means to unlock the device to allow the user to interface with and use the device for one or more of its capabilities (e.g., send and review email or text message, make or receive a phone calls, take photos, prepare and edit documents, browse or search the internet, play, use, or download a video, audio, a game or an application, etc.).

Types of biometrics range widely from chemical biometrics (e.g., DNA matching), to olfactory biometric (e.g., individual's odor), to signature recognition, to visual biometrics (e.g., ear shape, iris, retina, or face recognition), to finger/fingerprint recognition. Not surprisingly, the technologies employed to measure these various biometrics also range widely. For example, technologies used for finger/fingerprint recognition alone include the traditional mechanical methods (e.g., ink deposition to capture image of the valleys and ridges of the external surface of a finger), the more conventional optical methods (e.g., taking a picture of the finger to directly capture in electronic form the valleys and ridges of the external surface of a finger), thermal methods (e.g., measuring the heat flux between the ridges and sensor surface), ultrasound methods (e.g., using echo reflection of the ultrasonic energy to generate images of the internal layers of skin); and electrical methods (e.g., measuring the conductivity, capacitance, or radiofrequency (RF) field/electrical field to generate and capture a digital representation of the internal live layers of the fingerprint).

In order to facilitate use of such electronic devices, protective enclosures or cases, such as described herein, will need to be configured and/or constructed in a manner that will allow the user to interface with the biometric sensor on the device preferably without removal of the protective enclosure or case. More specifically, in the context of electrical methods of determining finger/fingerprint recognition, the user's finger will need to be able to electrically interface with the sensor (e.g., to activate and operate the sensor), notwithstanding the protective case or enclosure residing there-between. This is especially significant in the context of protective cases that fully enclose the electronic device, such as those described herein that have waterproof capabilities.

Figure 18:
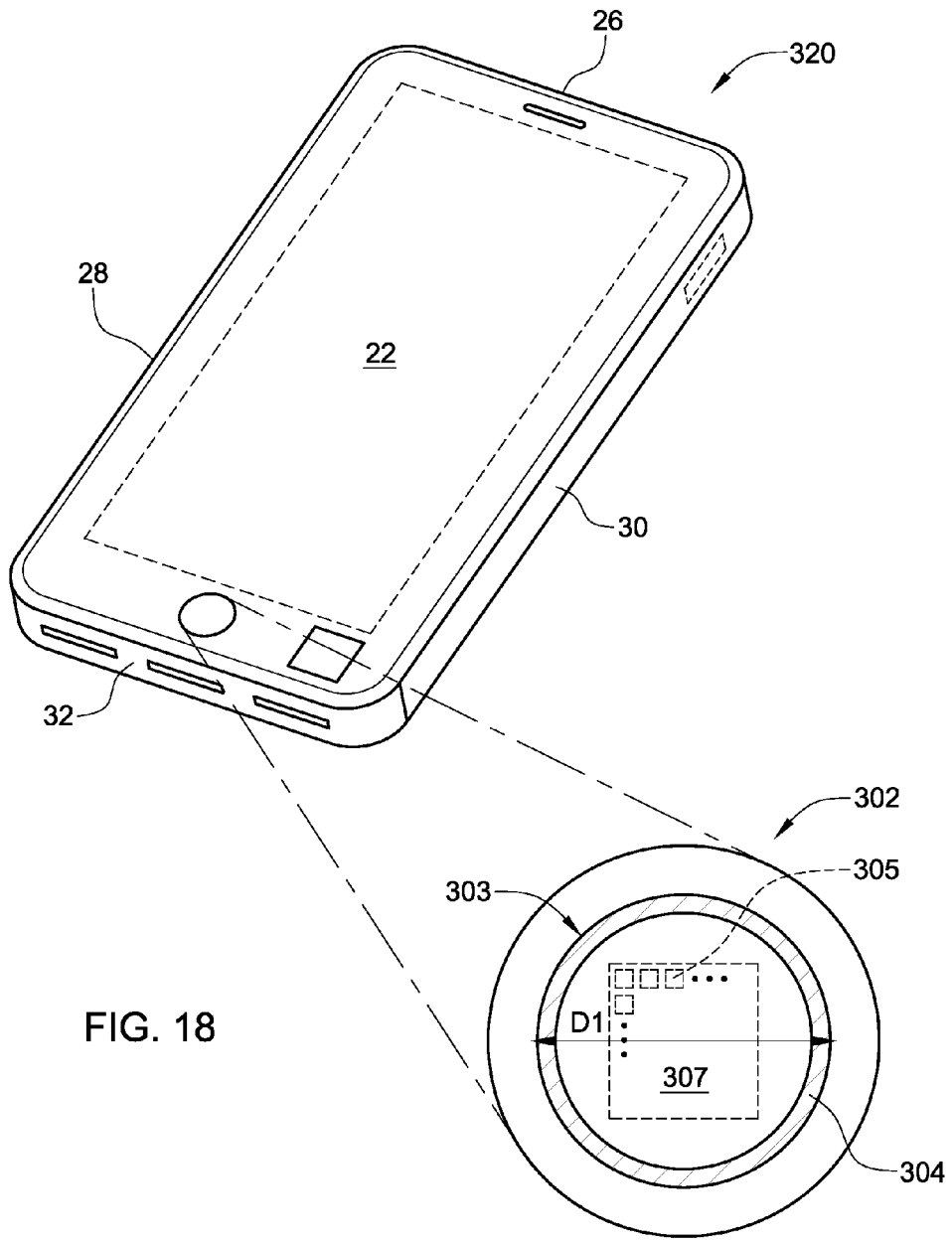
FIG. 18 is an illustration of a mobile device, such as that illustrated in FIGS. 2A-2B, with a fingerprint sensor incorporated into the home button.

Illustrated in FIG. 18 is an embodiment of an electric field fingerprint sensor 303 incorporated into the home button 302 of a mobile device 320, such as the type used in Apple iPhone® and iPad® products. See U.S. Patent Application Publication US 2013/0231046 A1 published Sep. 5, 2103, which is hereby incorporated by reference in its entirety. The mobile device depicted in FIG. 18 is basically the same as the mobile device 20 previously described, except that the mobile device 320 includes a fingerprint sensor 303 that is incorporated into the home button. It is contemplated that the home button 302, may be dynamic (e.g., depressible) like conventional iPhone® and iPad® devices or may be stationary.

Generally the fingerprint sensor 303 includes metallic/conductive electrode ring or element 304 that surrounds an array (e.g., one, two, three dimensional array) of electrical sensors 305 that are located at or below the surface 308 of a dielectric (a non-conductive material) layer 307 of the home button 302.

The electrode element 304 may have a circular shape as depicted in FIG. 18 or may have an oval, square, rectangular, triangular or other suitable ring or non-ring shape. The electrode element 304 may be formed as a continuous metallic conductor (e.g., steel) in the shape of a circular ring that forms a perimeter around the home button 302, such as that depicted herein. However, it should be understood that the electrode element 304 can be formed of non-continuous segments and may be configured to surround, fully or partially, the electrical sensors 305 contained within the home button 302, which may have the same or a different shape from that of electrode element 304.

The electrical sensors 305 may be comprised of an array of capacitive plates that are coupled to sensor circuitry (not shown) adapted to receive and processes the sensed signal communicated through the user's finger to verify the user's identity. While the sensors 305, including the capacitive plates thereof, may be incorporated within the home button 302 of the mobile device 320, it is contemplated that the electrical sensors 305 may be located in other parts of the device adjacent to a or removed from the home button 302 and/or outside the electrode ring element 304, for example in other active or inactive portions of the touchscreen display/screen of the mobile device 320 or perhaps the sides or the edges (26, 28, 30, and 32) of the device. In this regard, it is contemplated that a fingerprint sensor 303 may employ more than one electrode element 304 and more than one group or array of sensors 305 either in the same region or in one or more regions spaced apart from one another. It is also contemplated that the electrode element 304 may have an exterior outer surface 306 that is flat (as depicted herein), convex, concave or a combination thereof.

The dielectric layer 307 may be formed of any suitable material such as glass, plastic, ceramic, sapphire or sapphire coating etc. that forms the top outer surface 308 of the home button 302. All or a portion of the sensor 305 (e.g., the capacitive plates) may be embedded within the dielectric layer 307 or positioned to the underside of the dielectric layer 307. While in the illustrated embodiment, the dielectric layer 307 is circular and extends to cover only the region of the mobile device 320 and in particular the home button 302 within where the sensors 305 reside, it should be understood that under some circumstances the dielectric layer 307 may be formed in such a way that it may cover a portion or all of one or more electrode element 304 employed in the fingerprint sensor 303. Thus, in the illustrated embodiment, the dielectric layer 307, forms the top outer surface 308 of the home button 302 that is intended to be touched by the user's finger. The top outer surface 308, as illustrated herein, may be slightly concave, or alternatively, the top surface 308 may be flat or slightly convex or take on other configurations. Thus, while the home button 302 illustrated herein may be round or circular in shape, it should be understood that it may take other shapes such as and including but not limited to rectangular, oval, triangular shapes or combinations of shapes thereof. The top surface 308 of the button 302 may be preferably made of a dielectric material 307 having a dielectric constant or relative permittivity $\varepsilon_r$ in the range of 2 to 14 (at room temperature under 1 kHz) or less. In one embodiment, the top surface 308 of the button 302 is made in whole or in part of sapphire or coated with a synthetic sapphire coating that forms the top surface 308.

Generally, in operation, when the user moves a fingertip across the electrode(s) 304 and capacitive plates in electrical sensors 305, the electrode element 304 emits electrical energy, such as a signal (for example within the RF frequency range of 1 to 5 Mhz or other suitable frequency) into the user's finger and the electrical sensors 305 sense (via the array of capacitive plates) or measure the magnitude of the signal from the user's finger to capture a digital representation of the user's fingerprint and verify the users identity. A positive identification may allow a user to unlock or access the mobile device 320 and do so securely without typing in a password.

The embodiments illustrated in FIGS. 10-14 and the methods of use described herein provide unique solutions that are capable of allowing the desired operational interaction between the user's finger and the fingerprint sensor 303 on the electronic device through the interposed protective case. While the embodiments illustrated in FIGS. 10-14 are particularly configured and adapted for use with a home button 302 fingerprint sensor 303 like the one illustrated in FIG. 18, it should be understood that scope of the concepts and principles disclosed herein are equally applicable to other sensor configurations and applications without limitation.

Commonly illustrated in FIGS. 10-14 is a protective case 310 for a mobile device 320 with the mobile device 320 contained therein. Generally, other than the interface region overlying the fingerprint sensor, which in the preferred embodiments described herein is comprised of the fingerprint sensor interface 345 overlying the home button 302 and electrode element 304, the protective case 310 employs the same construction as previously described herein with respect to protective case 10 illustrated in FIGS. 1-9.

As previously noted, the mobile device 320 may be comprised of a home button 302 that includes, or is otherwise surrounded or partially surrounded by, one or more electrode elements 304, such as that depicted in the form of a ring in FIG. 18. The electrode element 304 may be interposed within the front surface 22 of the mobile device 320 and in turn may be surrounded, or partially surrounded, by the adjacent regions of the front surface 22 including potentially the screen 322 of the mobile device 320.

The protective case 310 may be comprised of a light-transmissive panel 330 (like the panel 130 described herein in connection with the protective case 10) for allowing a user to communicate with the touch screen/display 322 on the mobile device 320. The panel 330 may be surrounded and partially covered by a shell 340 (like the shell 40 described herein in connection with the protective case 10). A button aperture 126 extends through the front plate 122, like the one described herein in connection with the protective case 10, and is dimensioned to correspond with the dimensions of the home button 302 and the surrounding electrode element 304. A home button 302 and fingerprint sensor interface 345 resides within the button aperture 126.

In the embodiment illustrated in FIGS. 10-11, the button and fingerprint sensor interface 345 is comprised of a sensor interface conductive element 326 residing within the perimeter of the button aperture 126 that is configured to be in mating contact with electrode element 304. Accordingly, the top surface 308 of the button is exposed through the aperture of the sensor interface conductive element 326. Thus, in this embodiment the mobile device 320 would be completely encased except for the outer surface 308 of the home button 302. A sealing element (not shown) may be interposed between the sensor interface element 326 and the outer surface 308 of the home button 302, or perhaps embedded into the sensor interface element 326 at the internal circumference or perimeter, to limit or inhibit ingress of fluid or debris. The sealing element may be made of a suitable material for creating a seal such as polymers including soft plastics and rubbers with a low shore rating, such as silicone rubber may be used. The sealing element may also be configured to maintain the seal with the outer top surface 308 around the perimeter thereof of the home button 302. In applications where the home button is dynamic (e.g., depressible) like conventional iPhone and iPad devices the sealing element have sufficient resilience and be configured to maintain its seal when the button 302 is depressed. In such conventional dynamic/depressible home button design such as those employed by Apple, the depressible home button 302 has limited or no movement at its outer perimeter. Rather the greatest movement occurs at the center of the home button 302. Thus, conventional perimeter sealing elements, such as a silicone rubber or the like gaskets that are conforming or pre-conformed to the exterior configuration between the electrode element 304 and the outer top surface 308 of the home button 302 may also be employed in such applications as well. One advantage of the embodiment illustrated in FIGS. 10-11 is that it allows for the dynamic functionality of the home button 302. Another advantage of the embodiment illustrated in FIGS. 10-11 is that the electrical sensors 305 that contain the arrays of capacitive plates are not obstructed by an intervening element of the protective case 310 and thereby allows direct contact between the finger tissue of the user and outer top surface 308 of the home button 302 as intended by the manufacturer of the mobile device 320.

Figure 12:
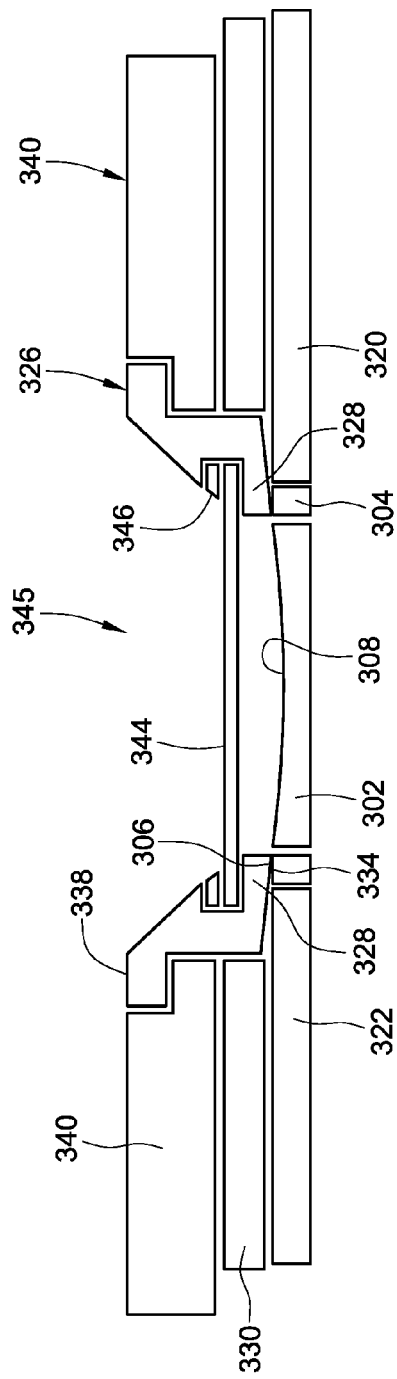
FIG. 12 shows a cross-sectional view of another embodiment of the fingerprint sensor user interface that includes a dielectric protective element configured to reside over the electrical sensing elements of the fingerprint sensor of the electronic device for which the protective case is adapted or otherwise configured for use.
Figure 13:
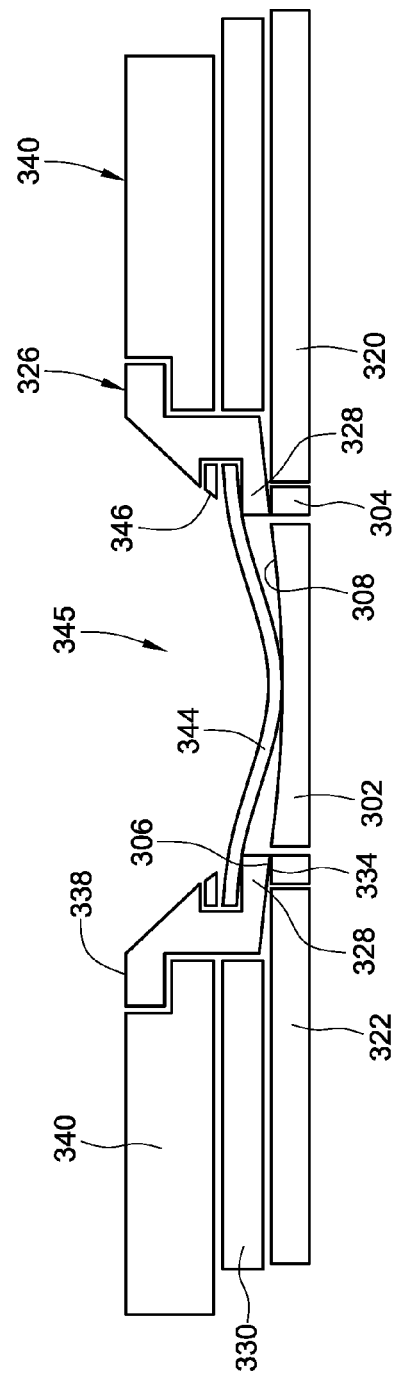
FIG. 13 shows a cross-sectional view of the fingerprint sensor user interface depicted in FIG. 12, wherein the dielectric protective element is in a stressed state, such as when depressed by the user to engage the underlying home button of the device.
Figure 14:
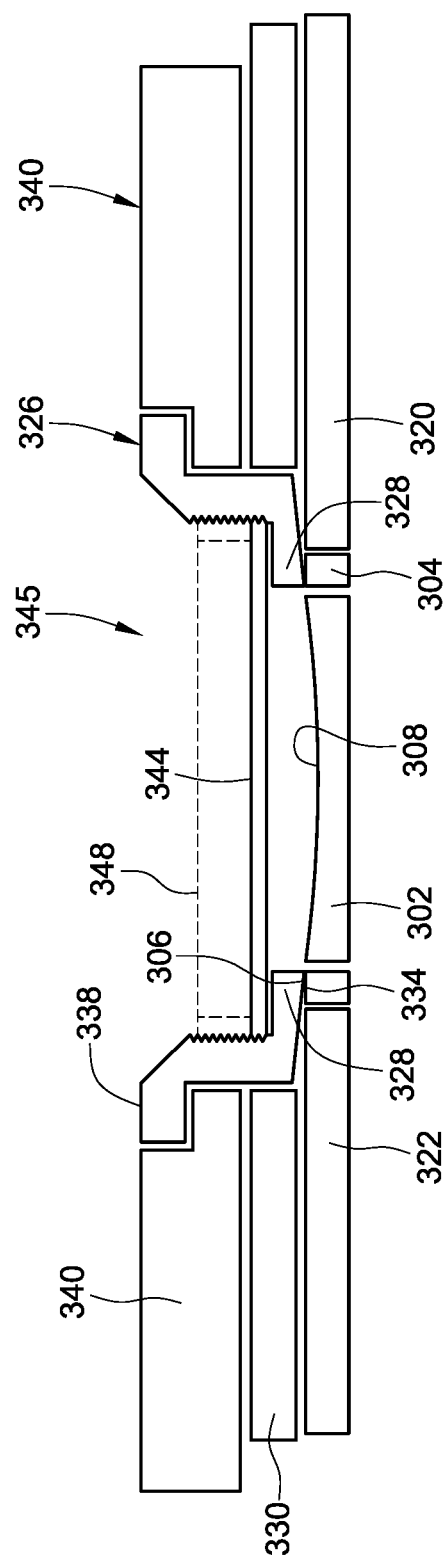
FIG. 14 shows a cross-sectional view of yet another embodiment of a fingerprint sensor user interface that includes a dielectric protective element such as that described in connection with FIGS. 12-13, which is supported in a threaded housing built into the conductive element that interfaces with the electrode element of the a fingerprint sensor.

FIGS. 12-14 illustrate embodiments of the fingerprint sensor interface 345 that in addition to the sensor interface conductive element 326 also include a protective layer or film element 344 that is dimensioned and configured to extend there-between above the electrical sensor 305 that resides below or within the dielectric layer 307 that forms the top outer surface 308 of the fingerprint sensor 303. The protective element 344 can be sealed mechanically, chemically, adhesively or other suitable means (e.g., RF welding) or combination of means to the sensor interface conductive element 326 and/or the perimeter of the button aperture 126. For example, the protective element 344 may be mechanically press fit within a slot residing within the internal perimeter of the sensor interface conductive element 326 using suitable metallic or polymer press-fit ring or gasket 346 such as that illustrated in FIGS. 12-13. Alternatively, the protective element 344 may be mechanically supported by a slot or ledge within the sensor interface conductive element 326 the walls of which, as depicted in FIG. 14, may be threaded. A cap element in a form of a ring (not shown) corresponding to the internal shape of the sensor interface conductive element 326 and having corresponding threads may be threaded into the sensor interface conductive element 326 to mechanically engage the protective element 344 to the sensor interface conductive element 326. A gasket or seal (such as previously described, e.g., made of silicone rubber or other suitable or like material) may be included between the cap element and one or both sides of the protective element 344 to further enhance the integrity of the seal between those elements. It should be understood that while the embodiment illustrated in FIG. 14 depicts a slot and thread arrangement where the threads are on the top and slot is on the bottom, it should be understood that this arrangement could be reversed such that the cap element is threaded into the sensor interface conductive element 326 from the opposite side (i.e., the bottom or inside) of that depicted in FIG. 14.

As illustrated in FIGS. 12-14 (which are not to scale), the protective film 344 may be slightly raised above the outer top surface 308 of the home button 302. However, it should be understood that the distance between the outer top surface 308 of the home button and the protective element 344 can be very slight (e.g., less than a 1 mm) or even non-existent. As illustrated in FIG. 13, the protective element 344 should be configured or formed or otherwise constructed to allow sufficient flex to engage the home button 302 and in applications where the home button 302 is depressible have sufficient flexibility to operatively depress the home button 302. In the embodiments illustrated in FIGS. 12 and 14, the protective element 344 is depicted as being generally planar in the unstressed state. However, it should be understood that the protective element 344 may be concave or convex or a combination thereof in shape and that such shape may facilitate movement and flexibility of the protective element 344 to allow it to engage with the underlying sensor 305 and the home button 302. Thus, it is contemplated that in one aspect the protective element 344 is concave in form and when depressed by the user in operation becomes convex in form to engage the outer top surface 308 of the home button 302. Alternatively, as previously noted the protective element 344 may be formed to correspond with the underlying shape of the fingerprint sensor 303 and/or home button 302.

One advantage of the embodiments illustrated in FIGS. 12-14 is that when the mobile device 320 is enclosed within the case 310, there is no portion of the mobile device 320 that is unprotected or exposed not even the top outer surface 308 of the sensor 303. In addition, the protective film element may provide yet a further obstacle or barrier to passage of liquids such as water into the electronic circuitry of the mobile device 320. It should be understood that the use of the protective film element 344 may be employed with or without the sealing element configured to maintain the seal with the outer top surface 308 around the perimeter thereof of the home button 302 described above in connection with the embodiment depicted in FIGS. 10-11.

The protective element 344 may be manufactured from any suitable dielectric or polymer material. For example, it is contemplated that the protective film 344 may be made of a transparent or a non-transparent, elastic, polyester film, polyethylene, or biaxially-oriented polyethylene terephthalate (boPET). In one embodiment, the protective film 344 may be extruded PET such as that sold under the Mylar® trade name by of DuPont™. For example, it is contemplated,
the protective film, such as that formed of PET (e.g., Mylar) or other polymer or dielectric material may be 0.1 to 1 mm in thickness; between 0.03 to 0.5 mm in thickness; between 0.01 to 0.1 mm in thickness; and perhaps more preferably between 0.03 to 0.075 mm in thickness and perhaps even more preferably between 0.036 to 0.05 mm and perhaps even more preferably at 0.05 mm+/−0.01 mm. It is contemplated that the protective film layer may be 0.01 mm in thickness or less.

While a flexible film protective element 344 is described herein, it should be understood that the protective element 344 may be formed of one more components with a flexible region and a less flexible or more rigid region. The flexible region may be formed at the perimeter of the element and interface with or be in proximity to the sensor interface conductive element 326 as described above and the more rigid region may be more centrally located within the boundaries of the protective element 344. Alternatively, the more rigid region may be formed at the perimeter of the element and interface with or be in proximity to the sensor interface conductive element 326 as described above and the more flexible region of the protective element 344 may be more centrally located within the boundaries of the protective element 344. The more rigid portion of the protective element 344 may be achieved by employment of different materials (e.g., glass, sapphire, ceramic, rigid plastic or other suitable dielectric material) relative to the more flexible regions or may be achieved by varying (e.g., increasing) the relative thickness of the protective element 344 so that perimeter regions of the protective element 344 may be thinner or thicker than the internal regions of the protective element 344.

The sensor interface conductive element 326, which is commonly disclosed in the embodiments depicted in FIGS. 10-14, is generally in a form of a ring that includes an upper portion 332 that is intended and configured to interface or come into contact with the user's finger and a lower portion 328 that is intended and configured to interface with exposed regions of the electrode element 304 of the fingerprint sensor 303. The lower portion 328 includes a bottom surface 334 that is dimensioned and shaped to correspond with and mate to the external configuration of the top outer surface 306 of the electrode element 304 of the fingerprint sensor 303. In the embodiment illustrated in FIGS. 10-11, the respective mating surfaces for bottom surface 334 of the sensor interface conductive element 326 and the top outer surface 306 of the electrode element 304 of the fingerprint sensor 303 are generally in a form of a flat planar ring. In this embodiment, the lower portion 328 of the sensor interface conductive element 326 has a generally rectangular cross-section. In contrast, in the embodiment illustrated in FIGS. 12-14, the respective mating surfaces for bottom surface 334 of the sensor interface conductive element 326 and the top outer surface 306 of the electrode element 304 of the fingerprint sensor 303, while also in the form of a ring, are not flat. Rather, in this embodiment, the lower portion 328 of the sensor interface conductive element 326 has a generally trapezoidal cross-section. Accordingly, the bottom portion 328, defined by the bottom surface 334, may have various cross-sectional shapes comprising of a lower portion 328 having a rectangular cross section with a bottom base 334, and an upper portion 332 having a trapezoid-like cross section with a sliding lateral side 336 and a top base 338. In other embodiments, other cross-sectional shapes can be used for the button aperture 326.

The mating interface between the top surface 306 and bottom surface 334 should provide sufficient contact to facilitate communication of the electrical energy emitted by the electrode element 304 to the user's finger via the sensor interface conductive element 326 when the sensor is active or in use. It is also contemplated that the electrode element 304 may serve the dual purpose of also detecting the presence of the a user's finger to activate the sensor and hence the mating interface between the top surface 306 and bottom surface 334 should preferably provide sufficient contact to facilitate communication of the electrical energy emitted by the electrode 304 to the user's finger via the sensor interface conductive element 326 to activate the sensor by sensing the presence of the user's finger atop the upper portion 332 of the sensor interface conductive element 326 to activate the sensor 303. The trapezoidal cross-sectional shape may be advantages in maintaining sufficient conductive contact between the top surface 306 and the bottom surface 334 by providing a spaced relationship between its bottom surface 334 and the surface regions of the mobile device 320 adjacent to the outer perimeter of the electrode element 304 (such as the screen 322, of the mobile device).

The mating surfaces 334 and 306 of the interface conductive element 326 and the electrode element 304 respectively may be something other than flat and circular. For example, exposed surface 306 of the electrode element 304 may be convex or beveled (inwardly or outwardly relative to the perimeter) and may have any ring shape (e.g., oval, square, rectangular, triangular, circular, combination thereof). The ring may be comprised of an electrode element 304 that is formed of continuous metallic element or discontinuous metallic elements spaced apart from another to define a ring. The corresponding mating region of the bottom surface 334 of the sensor interface conductive element 326 would in a preferred implementation have a shape that corresponds to the ring shape of the electrode element 304 and a surface that mirrors that of the top outer surface 306 of the electrode element 304 so that when in operation the two surface 306 and 334 are mated with sufficient contact and/or proximity to facilitate communication of the electrical energy emitted by the electrode element 304 to the user's finger via the conductive element 326 of the sensor interface to activate and/or use the sensor 305.

It should be understood that FIGS. 10-14 are for illustrative purposes only and are not to scale. Dimensionally, the height (dimension from the bottom surface 334 to the top surface 338) of the sensor interface conductive element 326, may in a preferred embodiment be 2-3 mm+/−1 or 2 mm or even less. As previously described, the sensor interface conductive element 326 is formed of a conductive material that can effectively communicate electrical signals from the ring electrode element 304 to the user's finger to activate and use the fingertip sensor 305. It is contemplated that any metallic conductive material may be employed, including stainless steel. In a preferred embodiment the sensor interface conductive element 326 is formed of the same conductive material as that which forms the electrode element 304 of the mobile device 320, which the sensor interface conductive element 326 is configured to interface with. In another preferred embodiment, the sensor interface conductive element 326 is formed of conductive material that has the same, less, or greater electrical resistivity than the material that forms the electrode element 304 of the mobile device 320, which the sensor interface conductive element 326 is configured to interface with.

The button aperture in the shell 40 that receives the sensor interface conductive element 326 can be formed as part of the case 310 via insert molding, or any other mechanism known in the art. For example, material, such as plastic, for the shell 340 of the case 310 can be injected into a mold that contains the pre-placed button aperture and sensor conductive element 326 to form a single molded piece with a surrounding, or partially surrounding, shell 340.

In operation, electrical signals, for example, RF signals emitted from the electrode element 304 are communicated via the sensor interface conductive element 326 to the user's overlying finger (e.g. into the living layer of the skin of the finger). A resulting RF field is detected by the electrical sensors 305 including the capacitive plates of the fingerprint sensor 303 either directly through the top surface 308 of the dielectric layer 307 of the sensor 305 or via the intervening dielectric protective element 344. Upon detection, the sensor determines via its sensing circuitry whether the finger detected RF field matches an authorized fingerprint set within the fingerprint sensor 305.

It is further contemplated that in operation, the user may first swipe or place a finger over the fingerprint sensor interface 345 of the protective case 310 to activate or unlock the enclosed or protected electronic device as previously described. In some circumstances, it may be preferable that the user set (or condition) the sensor 303 with the protective case on the device, and then going forward swipe or place the finger over the fingerprint sensor interface 345 of the protective case 310 to activate or unlock the enclosed or protected electronic device 320. By setting the sensor with the protective case 310 in place, the sensor 303 will be conditioned to sense the user's finger with the protective case 310 in place and in particular through the fingerprint sensor interface 345, which may make the sensor 303 more reliable under such actual use conditions going forward. Thus, it is contemplated that in operation the user first encase or enclose the electronic device 320 within the protective case 310 so that the fingerprint sensor interface 345 of the protective case 310 overlies the finger print sensor 303 of the electronic device 320 in the intended or configured operational manner or placement. Then, the user sets or initializes the fingerprint sensor 303 with the protective case 310 on the electronic device 320 by placing a finger on top of the fingerprint sensor interface 345 to activate and set/initialize the fingerprint sensor 303 to recognize the user's finger. In this way, the fingerprint sensor 303 is conditioned to recognize the user's finger as sensed through the fingerprint sensor interface 345 of the protective case 310 that overlies and interfaces with the fingerprint sensor 303 as described. Once the fingerprint sensor 303 is set, the user then swipes or places the finger over the fingerprint sensor interface 345 of the protective case 310 to activate or unlock the enclosed or protected electronic device 320.

In situations where the device fingerprint sensor 303 is capable of recognizing multiple fingerprint images as valid images, it is contemplated that the user may condition the fingerprint sensor 305 on the device 320 under a first condition without the protective case 310 and under a second condition with the protective case 310 enclosing the device as previously described above. It is also contemplated that the user may use the same finger or one or more different fingers when setting the fingerprint sensor 305 under those various conditions to allow for reliable verification of the user's finger by the mobile device 320 when the device 320 is enclosed and protected in the case 310 as well as when it is removed or is used outside the case.

Figure 15:
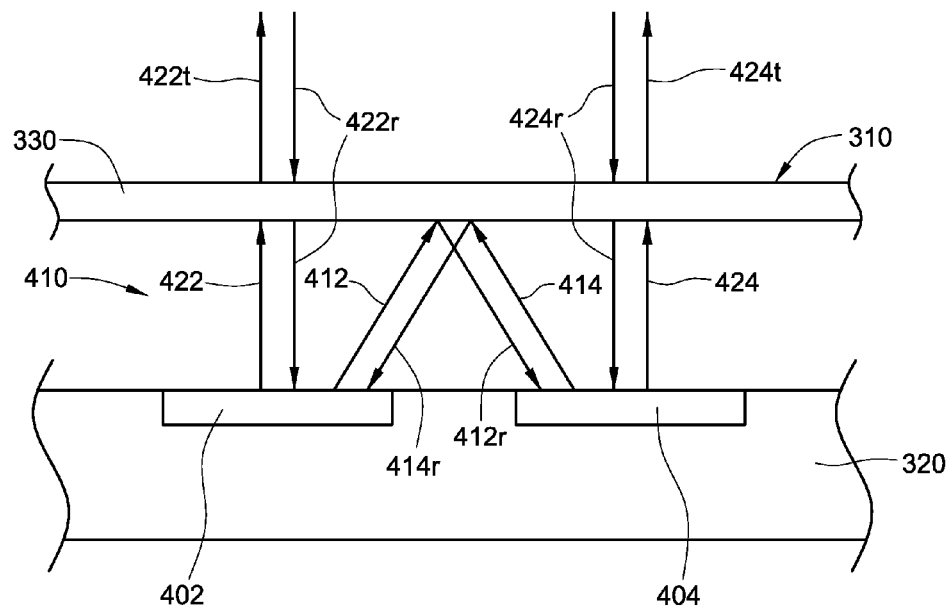
FIG. 15 shows a sectional view illustrating the operation of proximity sensors of a mobile device enclosed within a protective case having an internal surface that resides above and is spaced apart from the proximity sensors.

In some devices, one or more proximity sensors 402, 404 can be located near the microphone aperture 121, the speaker aperture 124, the camera aperture 125, or other places on the device and serve to detect when the device is in close proximity to an external objects (e.g., a user's pocket or face, etc.) so that the device can automatically turn off the screen or other features to facilitate, among things, power conservation. The inventors here have recognized, as illustrated in FIG. 15, that when the mobile device 320 is housed within the protective case such as previously described (e.g., 10 and/or 310 above), a space 410 can develop between the internal surface of the protective case (e.g., the panel 330) and the screen surface 322 of the mobile device 320 on or near the overlying regions of the device that house the proximity sensors 402, 404. As a result, the proximity sensors 402, 404 may in operation detect light reflections 412r, 414r generated from each other, or perhaps from themselves that are reflected back as a result of the protective case rather than an external object thereto as intended. This, situation may also occur even when there is no space 410 as a result of the placement of a discontinuous component above the proximity sensor. In all such situations, a false or undesired trigger of the proximity sensors may occur, which in turn results in an unintended disabling of the touch screen interface of the mobile device 320. For users of protective cases this can be a frustrating experience.

Figure 16:
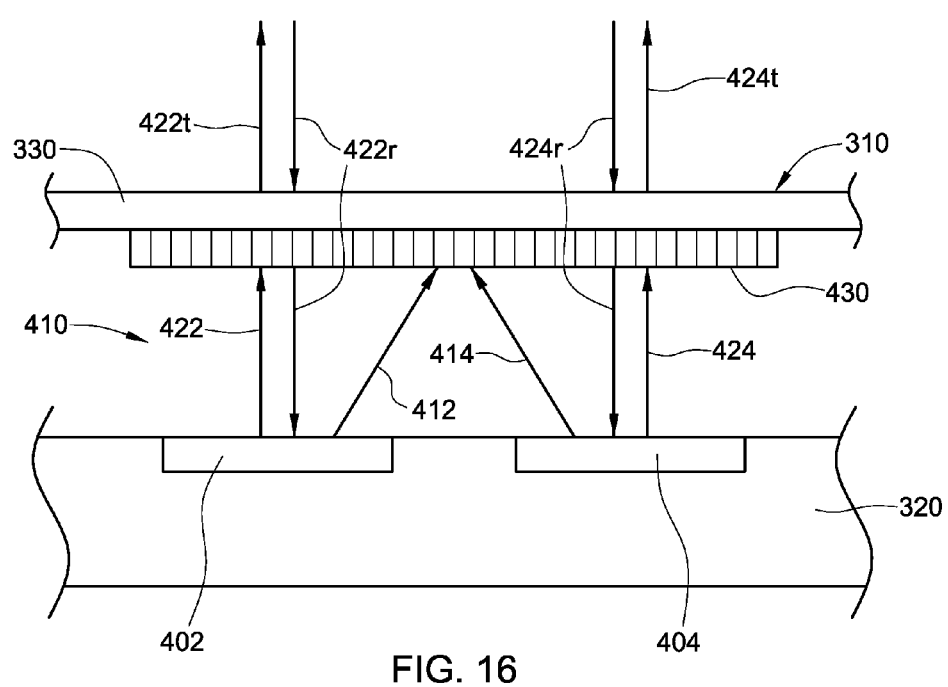
FIG. 16 shows a sectional view illustrating proximity sensors of a mobile device with a protective case illustrated in FIG. 15, that includes an internally positioned polarizing element configured to reside above one or more of the proximity sensors to polarize the light being transmitted therefrom.

FIG. 16 shows a sectional view illustrating the proximity sensors 402, 404 of the mobile device 320 with the protective case 310 having a privacy layer 430 for correcting the problem of reflection from the screen 330. In the present embodiment, a privacy layer 430 is placed between the screen 330 of the case 310 and the screen surface 322 of the mobile device 320. The privacy layer 430 is coated, layered glued or otherwise positioned underneath the region of the panel 330 of the case 310 configured to overlie the proximity sensors 402, 404.

The privacy layer 430 may be comprised of a polarizer element which allows the passing of light in a certain specified direction or orientation (e.g., perpendicular to the panel 330) and blocks or absorbs light that impinges on it from other directions. Thus, as illustrated in FIG. 16, light 412, 414 that is radiating in a direction other than the pass through direction will neither pass or be reflected back to one of the sensors. Yet light waves 422r, 424r, which are reflected back by objects external to the device, will come back to the proximity sensors 402, 404 to allow for the intended operation of those sensors.

Figure 17:
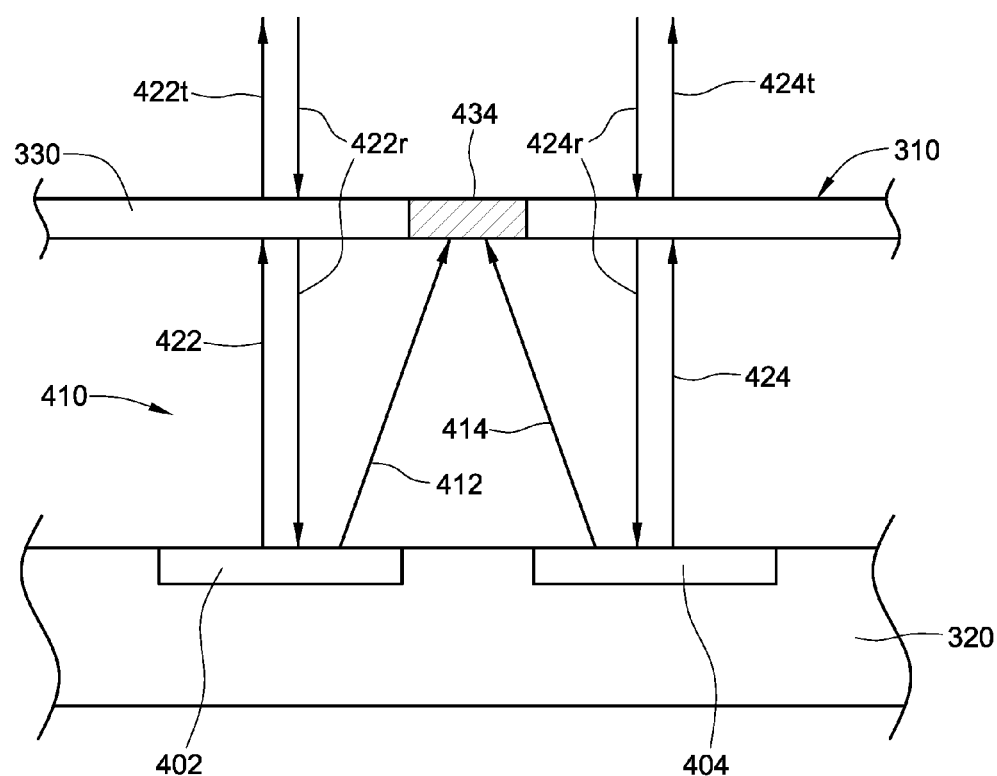
FIG. 17 shows a sectional view illustrating proximity sensors of a mobile device with a protective case illustrated in FIG. 15, that includes an internal positioned non-passing or light absorbing region or element configured to reside above one or more of the proximity sensors to isolate and/or absorb light that may interfere with the desired functionality.

FIG. 17 illustrates another embodiment that is capable of limiting undesired proximity sensor triggers. Specifically, FIG. 17 shows a sectional view illustrating the proximity sensors 402, 404 of the mobile device 320 with the protective case 310 and panel 330 wherein a non-passing area 434 (e.g., a light absorbing region) is positioned on the panel 330 in a region residing between the two proximity sensors to provide an isolation boarder or ring around or between the proximity sensors to isolate them from one another. The non-passing or light absorbing area 434 can be formed by coating, layering or gluing on the underside of the transmissive panel 330 a light-absorbing material 434, such as a dark ink or black body and/or including polarizing elements. Light 412, 414 radiating into the light-absorbing material 434 will be completely or significantly absorbed to limit or preclude being reflected back to the proximity sensor and thereby avoid undesired triggering of the proximity sensor. Yet light beams 422r, 424r, which are reflected back by objects external to the device, are still capable of returning back to the proximity sensors 402, 404 to trigger the sensor under the desired circumstances.

FIGS. 19-27 illustrate various aspects of additional implementations of a protective case 310a, which other than described in relevant part herein, are generally the same as the protective cases previously described.

Figure 19:
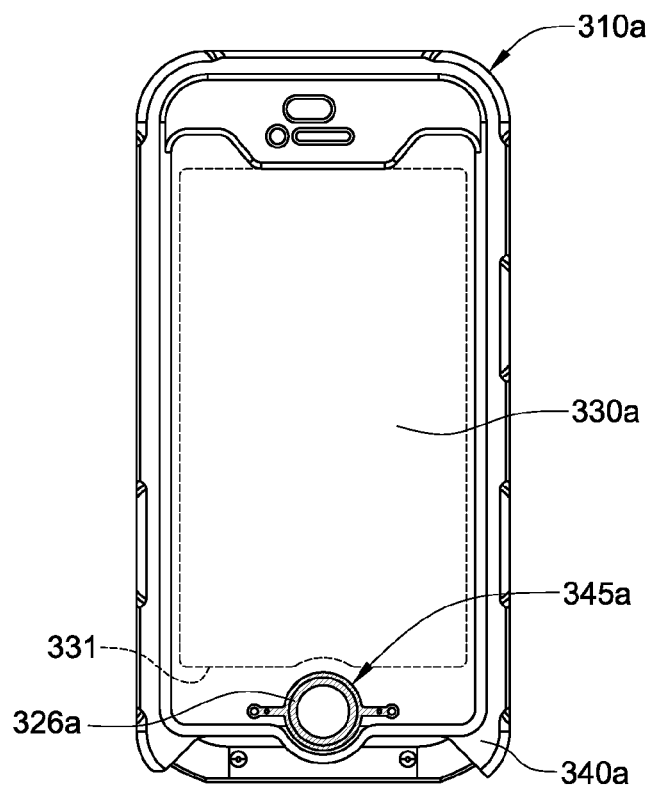
FIG. 19 shows a top view of another embodiment of a protective case for a mobile device like the one generally depicted in FIGS. 1-9. In this embodiment, like the embodiment depicted in FIG. 10, the protective case includes a fingerprint sensor user interface having a conductive element that is configured to interface with the electrode element of a fingerprint sensor, such as that depicted in FIG. 18, and is capable of functionally interfacing with such sensor. The conductive element is printed or otherwise, applied, inked or layered on opposing sides of a substrate element that overlies the fingerprint sensor. To better illustrate the fingerprint sensor user interface, the protective case, like the one illustrated in FIG. 10, is depicted without the second cap assembly described in connection with the protective case illustrated in FIGS. 1-9.

Specifically, FIG. 19 is a top view of a protective case 310a that includes the shell 340a (which includes e.g., the base unit 100, back plate 200, and cap assemblies and subcomponents as previously described), and also includes another exemplary implementation of a fingerprint sensor user interface 345a. The user interface 345a in this implementation is also comprised of a conductive element that is configured to functionally interface with the electrode element 304 of a fingerprint sensor 303, such as that depicted in FIG. 18. However, the conductive element 326a in this implementation is in the form of a metallic or conductive ink that is bonded or otherwise printed, adhered, or layered on opposing sides of a substrate or protective film element 344a in a location that is configured to at least in part overly the fingerprint sensor 303 of the mobile device 320 that the case 310a is configured to receive.

Figure 20:
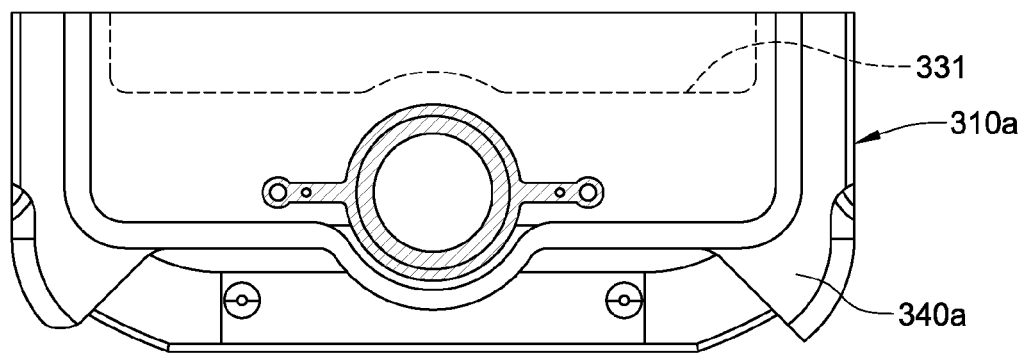
FIG. 20 is a more detailed top view of the lower region of the protective case containing the fingerprint sensor user interface illustrated in FIG. 19. The shaded region is the conductive element of the fingerprint sensor user interface that resides below the light-transmissive panel overlying the cell phone screen and extends across the home button aperture contained therein.

FIG. 20 is a more detailed top view of the lower region of the protective case 310a containing the fingerprint sensor user interface 345a illustrated in FIG. 19. The shaded region is the conductive element of the fingerprint sensor user interface that resides below the light-transmissive panel 330a overlying the cell phone screen and extends across the home button aperture contained therein.

As illustrated in shadow in FIGS. 19-20, in order to visually conceal portions of the construction, portions of the internal surface of the light-transmissive panel 330a may be silkscreened with black or other suitably colored ink. In the embodiment illustrated in FIGS. 19 and 20, the shadow line 331 around the perimeter of the light-transmissive panel 330a defines the region on the panel (outside the shadow line) where in a preferred implementation the underside of the panel 330a is silkscreened with an ink (e.g., black or other colored ink) that conceals or renders the perimeter region of the panel 330a opaque or less than fully transparent as compared to the more internal regions of the panel 330a, which would be transparent to allow for full unobstructed view of the underlying mobile device screen.

Figure 21:
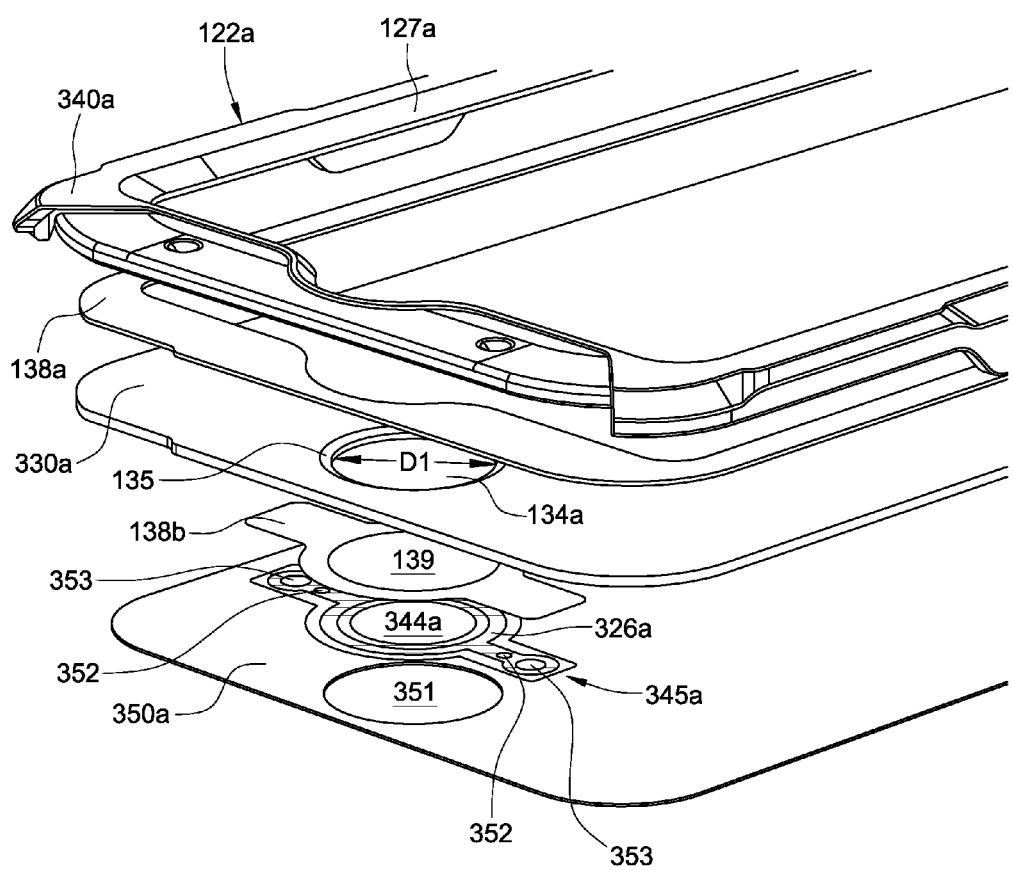
FIG. 21 is an exploded perspective view of the lower region of the protective case illustrated in FIGS. 19-20. Various components of the lower region of the protective case and the fingerprint sensor user interface incorporated therein are illustrated.

FIG. 21 is an exploded perspective view of the lower region of the front frame 122a of the base unit 100 of the protective case 310a illustrated in FIGS. 19-20. In order to provide a better illustration of the lay-up of the fingerprint sensor user interface 345a and the surrounding components, the middle frame 160 of the base unit 100 is not illustrated.

As illustrated in FIG. 21, the front frame 122a includes a rigid shell 340a frame that defines a screen aperture 127a, such as previously described in connection with FIGS. 1-10 above. A light-transmissive panel 330a (e.g., tempered or laminated glass) is mounted at its perimeter regions to the inside wall or surface of the rigid shell 340a frame using an adhesive layer 138a that conforms in shape with the mounting surface on the shell 340a as previously described. The region of the shell 340a configured to be adjacent to the home button is modified from the prior embodiments in that rather than entirely surrounding the home button, as illustrated in FIGS. 1A, 2A, and 10-14, it is configured to surround the home button region only along the lower bottom perimeter region.

The light-transmissive panel includes a home button aperture 134a. In the implementation illustrated, the home button aperture 134a includes a beveled edge 135 and is dimensioned (e.g., D1) to encompass and correspond in dimension with the underlying fingerprint sensor (e.g., D1 illustrated in FIG. 18) for which the case is designed for. The beveled edge facilitates greater access by the user finger. It is contemplated, however, that the dimensions of the home button aperture 134a may be larger or smaller than the dimensions of the fingerprint sensor 303. For example, it is contemplated that the dimensions of the home button aperture 134a may be smaller so that a portion (or all) of the electrode element is not contained within the aperture 134a but falls outside the aperture 134a. For example, the aperture 134a may have a diameter (D1 in FIG. 21) that is between the outer and inner diameter of the electrode element 304 depicted in FIG. 18 so that when the mobile device 320 depicted in FIG. 18 is positioned within the case the inner radial portion of the electrode element 304 is located below and within the perimeter of the aperture 134a and an outer radial portion of the electrode element 304 is located outside of the perimeter of the aperture 134a under the glass panel 330a. By way of another example, the aperture 134a may have a diameter (D1 in FIG. 21) that is smaller than the inner diameter of the electrode element 304 depicted in FIG. 18 so that when the mobile device 320 depicted in FIG. 18 is positioned within the case the entire electrode element 304 is located outside of the perimeter of the aperture 134a under the glass panel 330a. Alternatively, it is contemplated that the aperture 134a may have a diameter (D1 in FIG. 21) that is greater than the outer diameter of the electrode element 304 depicted in FIG. 18 so that when the mobile device 320 depicted in FIG. 18 is positioned within the case the entire electrode element 304 is located within the perimeter of the aperture 134a. In a preferred implementation, it is contemplated that the diameter of the aperture 134a be 1 to 3 millimeters greater than the diameter or outer dimensions of the underlying fingerprint sensor 303.

Further illustrated in FIG. 21 is another implementation of the fingerprint sensor interface 345a that includes a protective film element 344a and conductive element 326a that can be in the form of one or more conductive ink layers 326a1 and 326a2 bonded or otherwise applied or adhered onto a substrate element 344a. The fingerprint sensor interface 345a can be laminated to the glass panel 330a with an adhesive layer 138b like the adhesive 138 previously described. In order to facilitate direct contact between the substrate element 344a and fingerprint sensor, the adhesive layer 138b may include an aperture 139 that is dimensioned to correspond with the aperture 134a in the glass panel 330a. The dimension of the aperture 139 may be greater than the dimension of aperture 134a so that the fingerprint sensor interface 345a is not bonded or otherwise attached all the way to the perimeter edge region of the home button aperture 134a of the glass panel 330a. In order to further improve the water resistance of the protective case, the adhesive 138a (as is the case for all the adhesives referenced herein) may be waterproof or water resistant. An additional laminate layer 350a may be applied over the fingerprint user interface 345a after the interface 345a is attached to the panel 330a via the adhesive 138b. The laminate layer 350a may be an optically clear film with an adhesive on the inner side that allows it be glued or bonded over the fingerprint sensor user interface 345a. In the embodiment illustrated in FIG. 21 the laminate layer 350a extends and is bonded over the full, or substantially the full, length and width of the inner surface or inner side of the glass panel 330a on top of the fingerprint sensory user interface 345a. As illustrated in FIG. 21, the laminate layer 350a includes an aperture 351 that is configured to facilitate direct contact and interaction between the substrate element 344a and the underlying fingerprint sensor 303.

Figure 22:
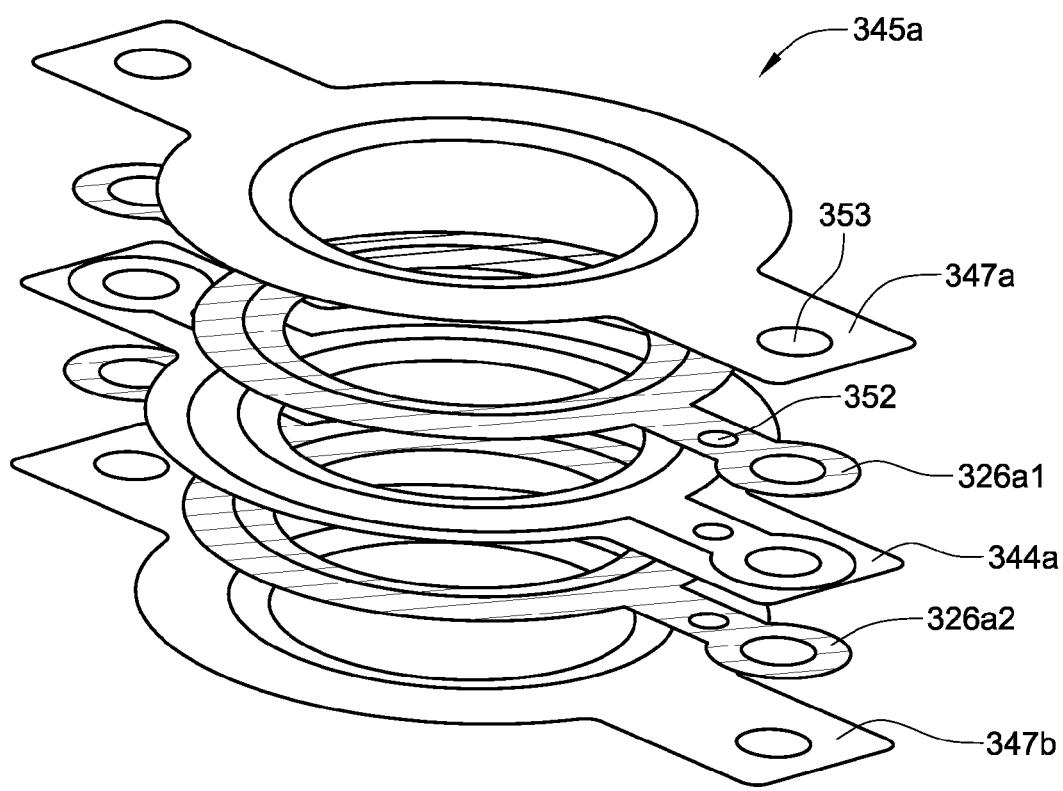
FIG. 22 is an exploded perspective view of the conductive and substrate elements of the fingerprint sensor user interface of the protective case illustrated in FIGS. 19-21. An example of a lay-up of the conductive and substrate elements of the fingerprint sensor user interface including the layers of conductive ink on opposing sides of a polymer substrate is illustrated. The opposing conductive ink layers are in physical and/or electrical contact with each other. Each conductive ink layer includes a primary region that is configured to reside above the electrode element of a fingerprint sensor and one or more secondary regions, illustrated in the form of projections extending radially outward from the primary region.

FIG. 22 is an exploded perspective view of an exemplary lay-up of the conductive and substrate elements 326a1, 326a2 and 344a, respectively, of the fingerprint sensor user interface 345a of the protective case 310a that is illustrated in FIGS. 19-21. The lay-up is comprised of a substrate or protective element 344a that that is layered with conductive ink 326a1 and 326a2 on opposing sides. The opposing conductive ink layers 326a1 and 326a2, although separated by the substrate sheet 344a, are as explained in more detail below layered onto the substrate sheet in such a manner so as to allow for at least some physical and/or electrical contact with each other. Each conductive ink layer 326a1 and 326a2 includes a primary region (e.g., within the ring region) that is configured to reside above the electrode element 304 of a fingerprint sensor 303 and one or more secondary regions in the form of projections that extend radially outward from the primary region. The fingerprint sensor user interface 345a may also be sandwiched within opposing layers of a protective coating 347a and 347b. The protective coating may also be formed of conductive ink or material.

In construction, the substrate material perhaps provided in a roll, is cut into appropriate sheets and cleaned with appropriate cleaning solution and/or cleaning cloth. As was the case with the protective film 344, the substrate 344a may be made of a transparent or a non-transparent, elastic, polyester film, biaxially-oriented polyethylene terephthalate (boPET), polyethylene terephthalate (PET), polyethylene terephthalate polyester (PETP), or any another suitable material. For example, it may be extruded PET such as that sold under the Mylar® trade name by of DuPont™ or other polymer or dielectric material. The substrate should be durable enough to withstanding the wear that is accompanied with repeated use and also preferably waterproof or water resistant. It is contemplated that the substrate 344a material may have a thickness of between 0.01 mm to over a 1 mm; between 0.03 to 0.5 mm; between 0.01 to 0.1 mm; perhaps more preferably between 0.03 to 0.075 mm; perhaps even more preferably between 0.036 to 0.05 mm; and perhaps even more preferably at 0.05 mm+/−0.01 mm. It is contemplated that the substrate or protective film 344a may be as little as 0.01 mm or less and formed of polymer material. The thickness of the substrate depends on the conductive coating used, its durability once incorporated in the case, and its ability to be sufficiently RF transparent to allow the RF emitted from the electrode element 304 to be received by the electrical sensors 305 of the fingerprint sensor 303. It should also be understood that the substrate 344a (at least the portion residing over the electrical sensors 305) like the protective film 344 is preferably a dielectric material. It should be understood that while, the embodiments of the fingerprint sensor user interface depicted herein, are shown with an conductive element, it is contemplated that the user interface may not require a conductive element but may be comprised of a very thin RF transparent film. However, such a thin film may suffer from unsuitable durability or deform with time and use.

Once the substrate is prepared, the conductive ink layer 326a1 is applied in any suitable manner, for example by silkscreen, onto the substrate. The conductive ink layer 326a is allowed to dry under room temperature and pressure conditions and/or is dried using appropriate air and/or heat mechanisms. In a preferred embodiment, the conductive ink is silver based conductive material. However, any suitable conductive material (copper, gold, steel, carbon, etc.) may be used. The conductive ink material may have an electrical conductivity that is the less, the same, or greater than the electrical conductivity of the electrode element 304 of the fingerprint sensor. It may be preferable, however, to employ a conductive ink material that has at least the same or greater electrical conductivity than that of the electrode element 304.

Once the first conductive ink layer 326a1 is applied to one side of the substrate 344a and dried, punch through holes 352 are formed through the conductive ink layer 326a1 and underlying substrate 344a. The punch through holes 352 are formed on the right, left side, or both sides of the primary region of the conductive ink layer 326a1 through the projections that form the secondary regions of the conductive ink layer. The purpose of the punch through holes 352 is to facilitate electrical communication (e.g., physical contact) between the opposing conductive ink layers 326a1 and 326a2. In construction, the punching action folds the conductive ink layer 326a1 slightly into the opposing side of the substrate element 344a, such that when the second conductive ink layer 326a2 is applied it would flow into the punch through holes 352, or the perimeter regions thereof, so as to touch the sides of the first conductive print layer 326a1.

Once the punch through holes 352 are formed, the unprinted opposing side of the substrate is cleaned, as previously described, and the conductive ink layer 326a2 is applied (e.g., via silkscreen or other suitable process or method) to the opposing side of the substrate element 344a and dried. After drying, the first side may be cleaned again and another coating of conductive ink 326a1 may be applied to the first side of the substrate to ensure electrical communication and physical contact between opposing sides of the conductive ink layers 326a1 and 326a2. This process can be repeated as necessary. Once the conductive ink coatings 326a1 and 326a2 are applied and dried, the fingerprint sensor user interface pre-form can be cleaned again and protective coatings 347a and 347b can be applied over the previously laid conductive ink coatings, a layer on each side at a time and then cured, such as with ultraviolet light. The protective coatings 347a and 347b may be an ultraviolet curable ink and may be comprised of either conductive and/or non-conductive material. The protective coatings may be transparent, semi-transparent, or opaque and may be include coloring such as black, white, red, blue, green, yellow, orange, pink, etc. that is selected to correspond, match or compliment the externally visible coloring scheme of the protective case 310a. It is contemplated that the coatings 347a and 347b be comprised of a material and be of a thickness as to not interfere with the electrical communication between the electrode element 304, the conductive element 326a and the user's finger.

Once the protective coatings 347a and 347b are applied and cured, another set of punch holes 353 are, in an exemplary construction, formed through the entire pre-form of the fingerprint sensor user interface 345a. The purpose of the second set of punch holes, is to position the pre-form into a mold that forms the pre-form into a three dimensional configuration (e.g., via heat formed process) that corresponds, in part or in whole, to the external surfaces of the fingerprint sensor 303 including the outer surface overlying the electrical sensors 305 and/or the outer surface of the electrode element 304. Once formed the pre-form of the fingerprint sensor user interface can be die-cut to the desired shape or otherwise finished as needed prior to incorporation into the protective case 310a.

The position and size of the punch through holes 352 and 353 can be optimized so that they are spaced far enough away from the home button aperture 134a in the glass panel 330a to ensure that there is sufficient surface area on the glass panel 330a for the waterproof adhesive 138b to fully surround the punch holes 352 and 353 to seal them from the aperture 134a in the glass panel 330. A strong and waterproof bond can thus be established. While it is contemplated that the light-transmissive panel 330a be constructed of glass, it should be understood that as previously noted, the light-transmissive panel 330a may be comprised of any rigid or flexible material that has sufficient transparency for the user to view the mobile device screen.

Figure 26:
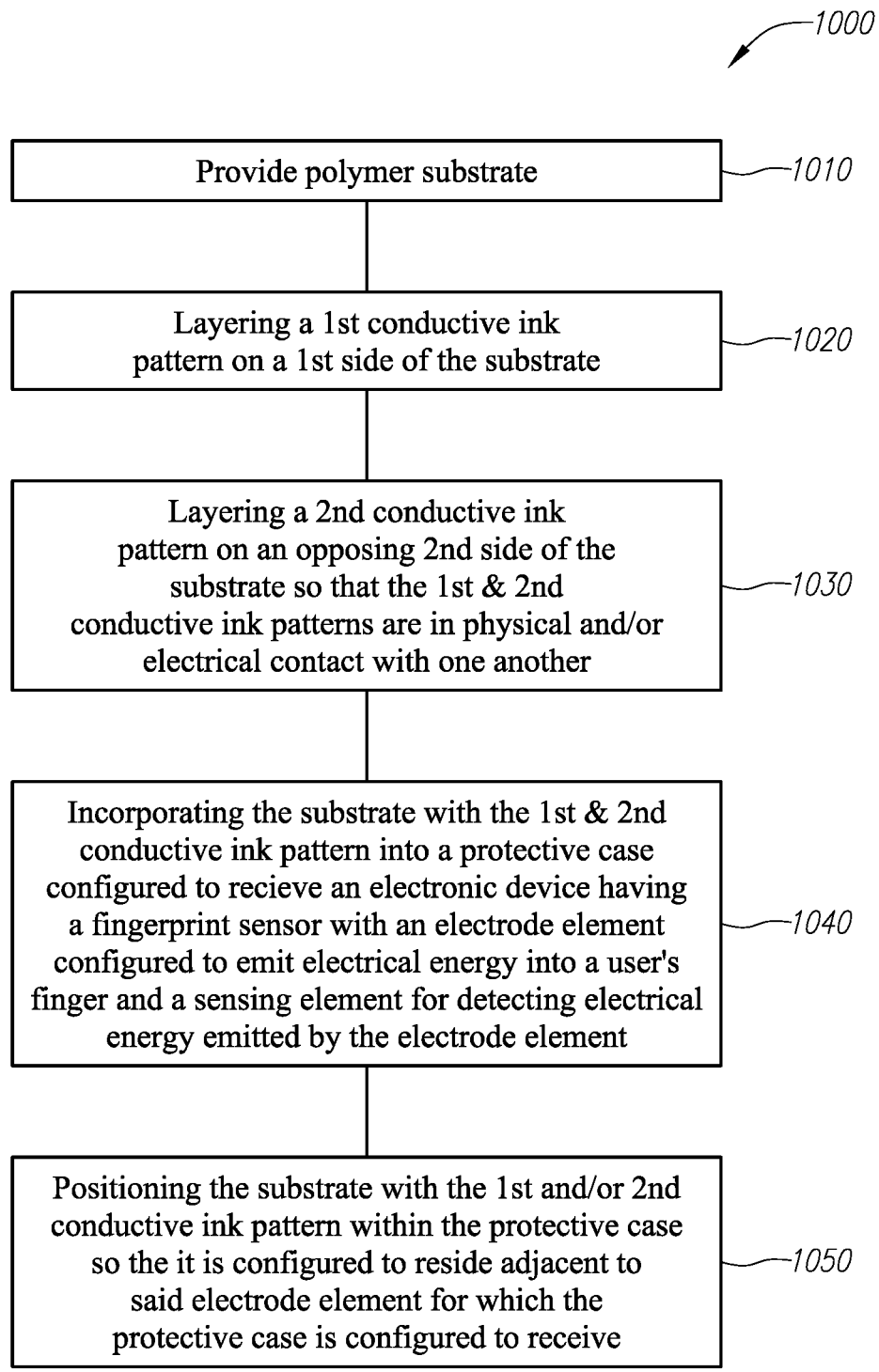
FIG. 26 is flow chart reciting selective steps for a process for making a protective case for a biometric secured mobile device includes a biometric sensor user interface such as those described herein.

FIG. 26 is flow chart reciting selective steps 1010, 1020, 1030, 1040, and 1050 for a process 1000 for making a protective case for a biometric secured mobile device that includes a biometric sensor user interface such as those described herein. FIG. 26 is basically a summary of the construction of the fingerprint sensor user interface construction previously detailed above.

Figure 23A:
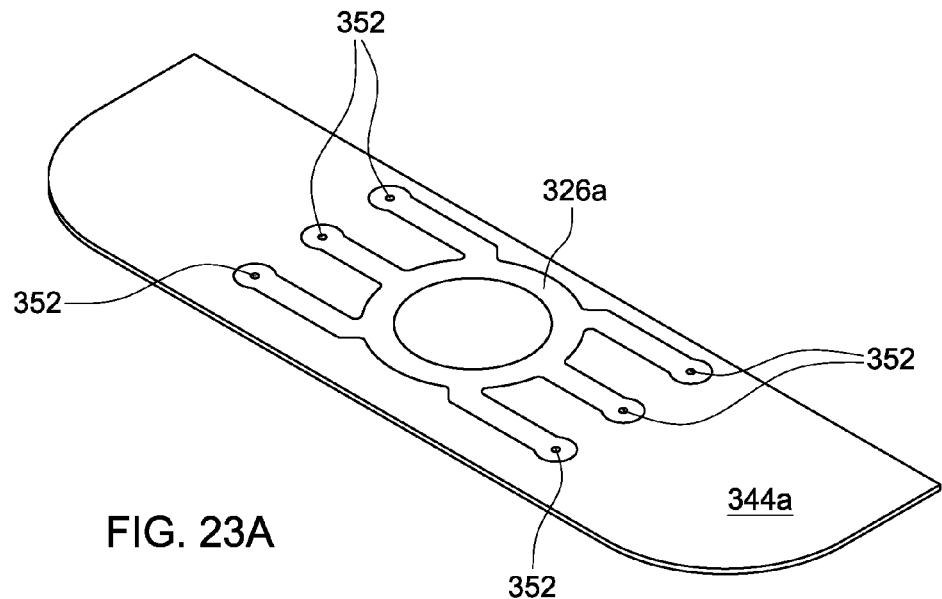
FIG. 23A is an illustration of an alternative conductive ink configuration for the fingerprint sensor user interface illustrated in FIGS. 19-22, wherein the conductive ink element includes a primary region that is configured to reside above the electrode element of a fingerprint sensor and multiple secondary regions in the form of projections that extend on either side of the primary region radially outward therefrom. As in the case of the fingerprint sensor user interface depicted in FIG. 22, the opposing conductive ink layers are in physical and/or electrical contact with each other and are positioned on either side of a substrate sheet.
Figure 23B:
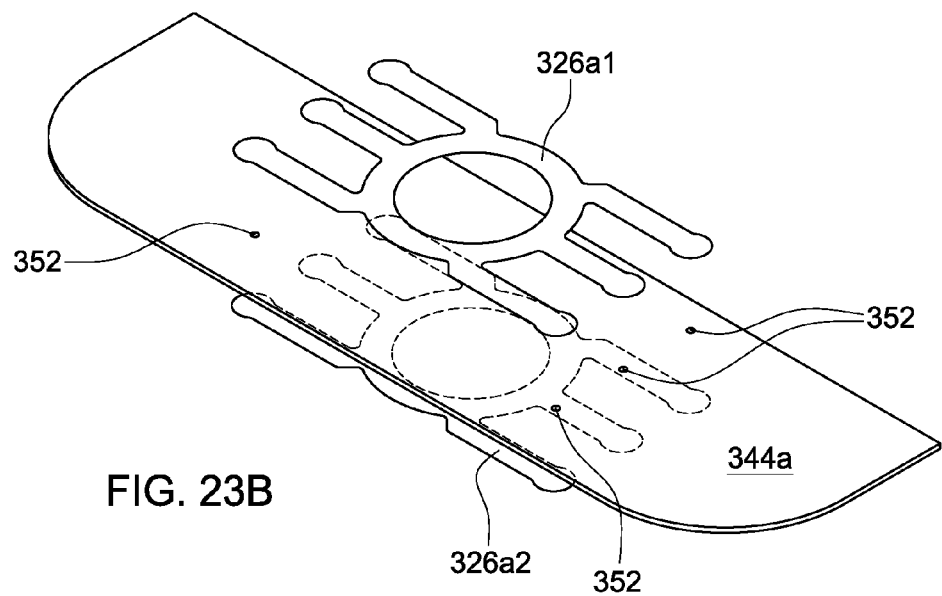
FIG. 23B is an exploded view of the substrate and the opposing layers of the conductive ink element of the alternative conductive ink configuration illustrated in FIG. 23A.

FIGS. 23A-B and 24A-B are some alternative pattern variations for the conductive ink layers 326a1 and 326a2. Specifically, FIG. 23A is an illustration of an alternative conductive ink configuration for the fingerprint sensor user interface illustrated in FIGS. 19-22, wherein the conductive ink element 326a includes a primary region that is configured to reside above the electrode element 304 of a fingerprint sensor 303 and multiple secondary regions in the form of projections that extend on the left and right side of the primary region radially outward therefrom. As in the case of the fingerprint sensor user interface depicted in FIG. 22, the opposing conductive ink layers are in physical and/or electrical contact with each other and are positioned on opposing sides of a substrate sheet. FIG. 23B is an exploded view the substrate 344a and the opposing layers of the conductive ink 326a1 and 326a2 of the alternative conductive ink configuration illustrated in FIG. 23A.

Figure 24A:
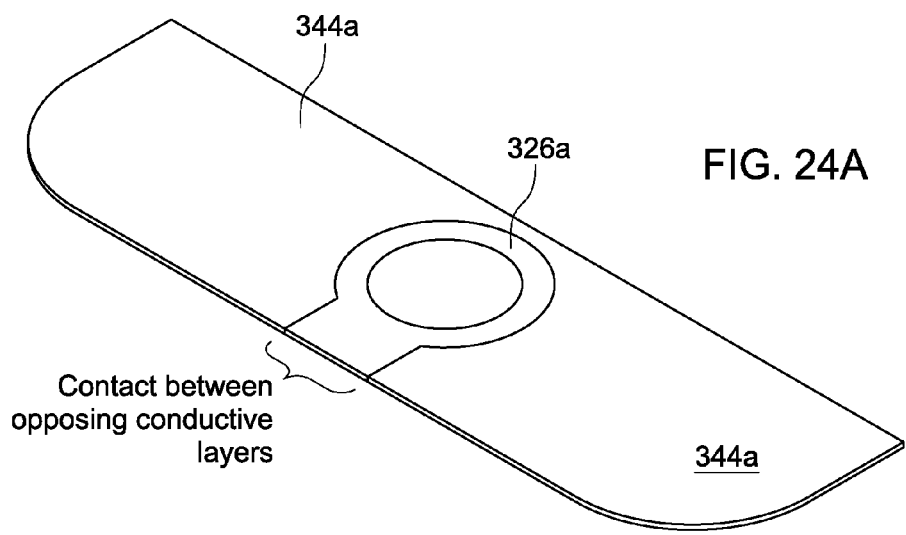
FIG. 24A is an illustration of another alternative conductive ink configuration for the fingerprint sensor user interface illustrated in FIGS. 19-22, wherein the conductive ink element includes a primary region that is configured to reside above the electrode element of a fingerprint sensor and a secondary region in the form of single projections that extends downward and radially outward from the primary region. As in the case of the fingerprint sensor user interface depicted in FIG. 22, the opposing conductive ink layers are in physical and/or electrical contact with each other and are positioned on either side of a substrate sheet.
Figure 24B:
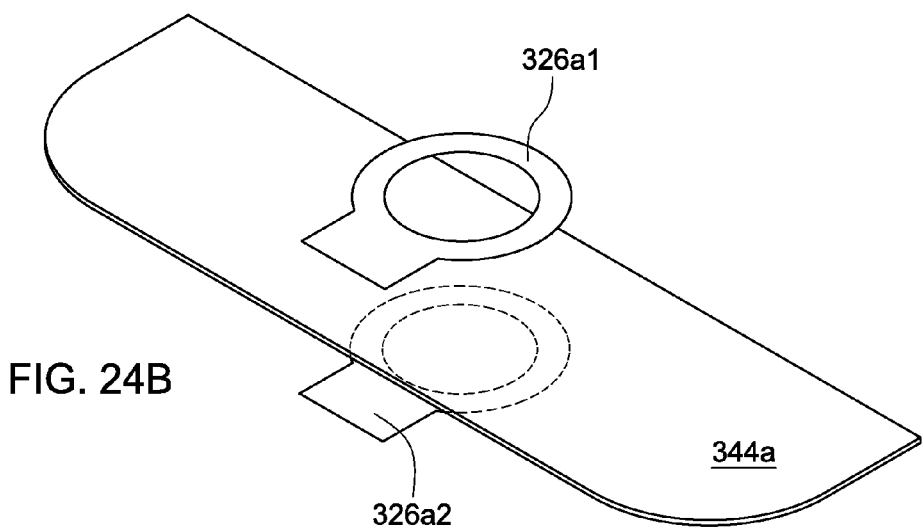
FIG. 24B is an exploded view of the substrate and the opposing layers of the conductive ink element of the alternative conductive ink configuration illustrated in FIG. 24A.

FIG. 24A is an illustration of another alternative conductive ink configuration for the fingerprint sensor user interface illustrated in FIGS. 19-22, wherein the conductive ink element 326a includes a primary region that is configured to reside above the electrode element 304 of a fingerprint sensor 303 and a secondary region in the form of single projections that extends downward and radially outward from the primary region. As in the case of the fingerprint sensor user interface depicted in FIG. 22, the opposing conductive ink layers are in physical and/or electrical contact with each other and are positioned on either side of a substrate sheet. In this implementation, however, physical and electrical contact between the opposing layers of conductive ink 326a1 and 326a2 is achieved, not by means of the punch through holes 352 as previously described, but rather by contact of the conductive ink layers at the edge region of the substrate. Because there are no punch through holes to mediate the electrical communication between the layers, this implementation may be capable of adding structural integrity to the construction. It may also limit the region of the panel 330a that would need to be concealed from view by a silkscreening an opaque ink and thus potentially provide more flexibility in design. FIG. 24B is an exploded view of the substrate 344a and the opposing layers of the conductive ink element 326a1 and 326a2 of the alternative conductive ink configuration illustrated in FIG. 24A.

Figure 25:
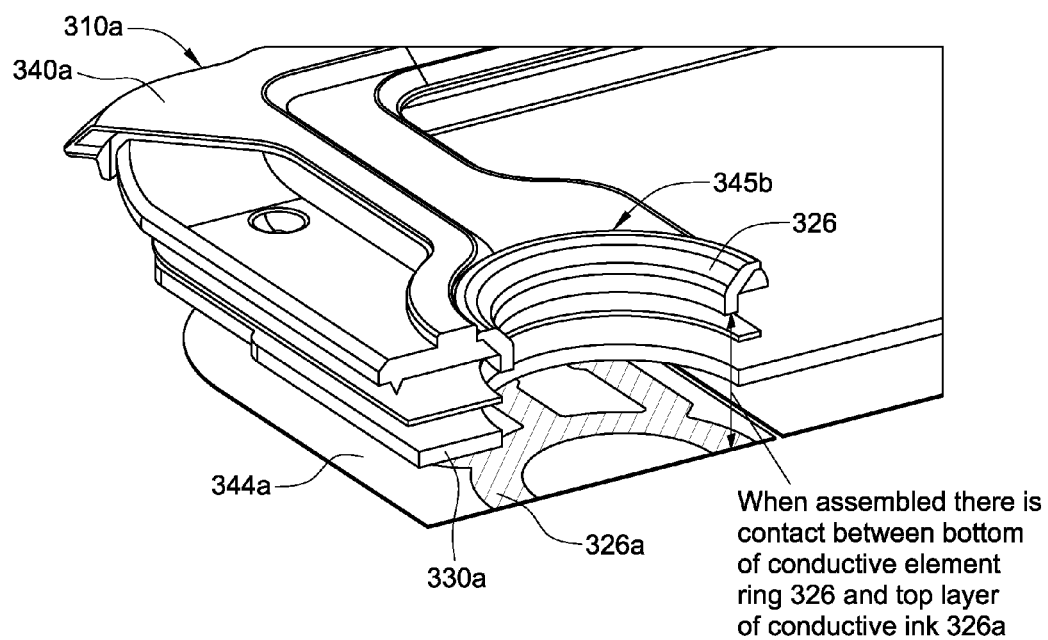
FIG. 25 is a partial exploded view of a modified embodiment of the protective case such as that illustrated in FIGS. 19-24, wherein the conductive element of the fingerprint sensor user interface is comprised of a first component that is printed or otherwise, applied, inked or layered on opposing sides of a substrate element such as that depicted in FIGS. 19-24 and a second electrically conductive component (such as the conductive elements depicted in FIGS. 10-14), which is positioned to overly and be in physical contact and/or electrical communication with the upper surface of the first component of the conductive element.

FIG. 25 is a partial exploded view of a modified embodiment of the protective case 310a illustrated in FIGS. 19-24, wherein the conductive element is comprised of a first component 326a that is printed or otherwise, applied, inked or layered on opposing sides of a substrate element such as that depicted in FIGS. 19-24 and a second electrically conductive component 326 generally similar to the conductive element depicted in FIGS. 10-14, which is positioned to overly and be proximately located to, or in physical contact and/or electrical communication with the upper surface of the first component of the conductive element.

Figure 27:
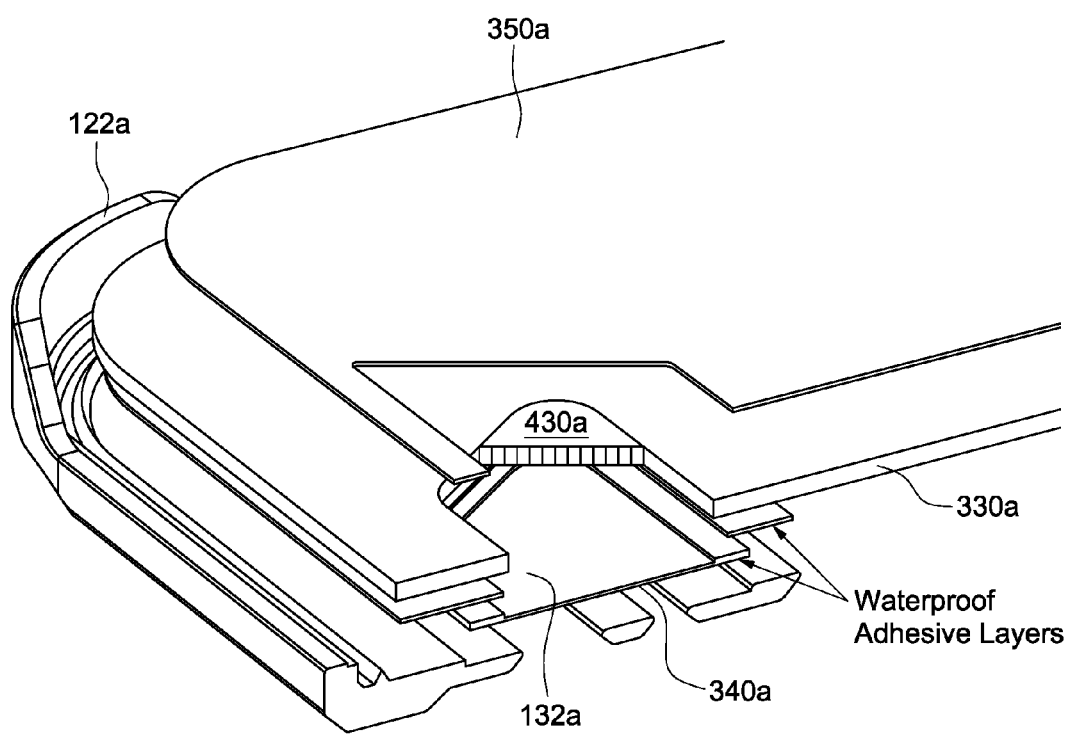
FIG. 27 is a partially exploded perspective view of the top region of the protective case illustrated in FIG. 19 providing a more detailed view of a polarizing element configured to reside within the case above the proximity sensor of the mobile device for which the case is configured to receive. More specifically, the polarizing element is contained within a compartment that is defined by an enlarged speaker aperture contained within a light-transmissive panel above a light-transmissive laminate that overlies the inner surface of the light-transmissive panel in a region above the proximity sensor.

FIG. 27 is a partially exploded perspective view of the top region of the front frame 122a of the protective case 310a illustrated in FIG. 19 providing a more detailed view of a polarizing element 430a configured to reside within the case 310a above the proximity sensors 402 and 403 illustrated in FIG. 16 of the mobile device for which the case is configured to receive. More specifically, the polarizing element 430a is contained within a compartment that is defined by an enlarged speaker aperture 132a contained within the light-transmissive panel 330a and separated from the mobile device by a laminate panel 350a that overlies the light-transmissive panel and extends over the regions of the speaker aperture 132a wherein the proximity sensor 430 is configured to reside adjacent thereto or below.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

Similarly, this method of disclosure, is not to be interpreted as reflecting an intention that any claim require more features than are expressly recited in that claim. Rather, as the following claims reflect, inventive aspects lie in a combination of fewer than all features of any single foregoing disclosed embodiment. Thus, the claims following the Detailed Description are hereby expressly incorporated into this Detailed Description, with each claim standing on its own as a separate embodiment.

What is claimed is:

1. A protective case for a mobile device, the mobile device including a speaker and a microphone and having front and back surfaces and side surfaces extending between the front and back surfaces, including a top side, a bottom side, a right side, and a left side, the protective case comprising:
   a substantially rigid middle frame configured to engage and substantially surround at least three of the surfaces of the mobile device, the middle frame comprising:
      a body having a front edge and a back edge, wherein the body at least partially encloses an interior volume;
      an aperture through the middle frame;
      a selectively-permeable seal covering the aperture;
      a gasket reinforcing the seal and providing a channel between the seal and a side surface of the mobile device, the gasket including a void extending from the first gasket edge next to the seal to the second gasket edge opposite the first edge and next to the side surface of the mobile device;
      a channel formed along the middle frame extending from the aperture, the channel being positioned adjacent to the void in the gasket and providing a continuous path for airflow to an interior chamber; and
      a plurality of inner ribs extending from the body toward the interior volume and configured to suspend or separate the side surfaces of the mobile device from the body, each of the inner ribs having a height, width, and depth; and
   a back plate configured to engage and substantially surround at least a back surface of the mobile device, the back plate comprising:
      a back panel; and
      at least two raised sides extending from the back panel toward the interior volume, the raised sides being configured to suspend the mobile device, creating the interior chamber between the back surface of the mobile device and the back panel, one of the raised sides including a recessed portion that does not extend toward the interior volume and positioned where the channel meets the raised side;
   wherein the height of each of the inner ribs of the plurality is at least 80 percent of the distance between the front edge and back edge of the body and the width is smaller than the height.

2. The protective case of claim 1, wherein the interior chamber provides a continuous path for airflow between the speaker and the microphone.

3. The protective case of claim 2, further comprising a button panel positioned in an aperture on the body and configured to engage one or more buttons on the mobile device and wherein at least one of the inner ribs on the body is positioned at one end of the button panel and projects inward from the button panel.

4. The protective case of claim 3, wherein at least two of the inner ribs on the body are configured to engage the top side of the mobile device, at least two of the inner ribs on the body are configured to engage the left side of the mobile device, and at least two of the inner ribs on the body are configured to engage the right side of the mobile device.

5. The protective case of claim 2, wherein at least two of the inner ribs on the body are configured to engage the top side of the mobile device, at least two of the inner ribs on the body are configured to engage the left side of the mobile device, and at least two of the inner ribs on the body are configured to engage the right side of the mobile device.

6. A protective case for a mobile device, the mobile device including a speaker and a microphone and having front and back surfaces and side surfaces extending between the front and back surfaces, including a top side, a bottom side, a right side, and a left side, the protective case comprising:
   a middle frame configured to engage and substantially surround at least three of the surfaces of the mobile device, the middle frame comprising:
      a body having a front edge and a back edge, wherein the body at least partially encloses an interior volume;
      an aperture through the middle frame;
      a selectively-permeable seal covering the aperture;
      a gasket reinforcing the seal and providing a channel between the seal and a side surface of the mobile device, the gasket including a void extending from the first gasket edge next to the seal to the second gasket edge opposite the first edge and next to the side surface of the mobile device;
      a channel formed along the middle frame extending from the aperture, the channel being positioned adjacent to the void in the gasket and providing a continuous path for airflow to an interior chamber; and a plurality of inner ribs extending from the body toward the interior volume and configured to suspend or separate the side surfaces of the mobile device from the body, each of the inner ribs having a height, width, and depth;

wherein the height of each of the inner ribs of the plurality is at least 80 percent of the distance between the front edge and back edge of the body and the width is smaller than the height.

7. The protective case of claim 6, further comprising a back plate configured to engage and substantially surround at least a back surface of the mobile device, the back plate comprising:

a back panel; and at least two raised sides extending from the back panel toward the interior volume, the raised sides being configured to suspend the mobile device, creating the interior chamber between the back surface of the mobile device and the back panel, one of the raised sides including a recessed portion that does not extend toward the interior volume and positioned where the channel meets the raised side.

8. The protective case of claim 7, wherein the interior chamber provides a continuous path for airflow between the speaker and the microphone.

9. The protective case of claim 8, wherein at least two of the inner ribs on the body are configured to engage the top side of the mobile device.

10. The protective case of claim 9, wherein at least two of the inner ribs on the body are configured to engage each of the right and left sides of the mobile device.

11. The protective case of claim 10, further comprising a button panel positioned in an aperture on the body and configured to engage one or more buttons on the mobile device.

12. The protective case of claim 11, wherein there is an inner rib positioned at one end of the button panel and projecting inward from the button panel.

13. A protective case for a mobile device, the mobile device including a speaker and a microphone and having front and back surfaces and side surfaces extending between the front and back surfaces, including a top side, a bottom side, a right side, and a left side, the protective case comprising:

a substantially rigid middle frame configured to engage and substantially surround at least three of the surfaces of the mobile device, the middle frame comprising:

a body having a front edge and a back edge, wherein the body at least partially encloses an interior volume;

an aperture through the middle frame;

a selectively-permeable seal covering the aperture;

a gasket reinforcing the seal and providing a channel between the seal and a side surface of the mobile device, the gasket including a void extending from the first gasket edge next to the seal to the second gasket edge opposite the first edge and next to the side surface of the mobile device;

a channel formed along the middle frame extending from the aperture, the channel being positioned adjacent to the void in the gasket and providing a continuous path for airflow to an interior chamber; and a plurality of inner ribs positioned between the front edge and back edge of the body and extending outwardly from the body toward the interior volume and configured to suspend or separate the side surfaces of the mobile device from the body;

a back panel positioned at the back edge of the middle frame; and at least two raised sides extending from the back panel toward the interior volume, the raised sides being configured to suspend the mobile device, creating the interior chamber between the back surface of the mobile device and the back panel, one of the raised sides including a recessed portion that does not extend toward the interior volume and positioned where the channel meets the raised side.

14. The protective case of claim 13, wherein the interior chamber provides a continuous path for airflow between the speaker and the microphone.

15. The protective case of claim 14, wherein at least two of the inner ribs on the body are configured to engage the top side of the mobile device.

16. The protective case of claim 15, wherein at least two of the inner ribs on the body are configured to engage each of the right and left sides of the mobile device.

17. The protective case of claim 14, wherein at least two of the inner ribs on the body are configured to engage each of the right and left sides of the mobile device.

18. The protective case of claim 14, further comprising a button panel positioned in an aperture on the body and configured to engage one or more buttons on the mobile device.

19. The protective case of claim 18, wherein at least one of the inner ribs on the body is positioned on and projecting inward from the button panel.

20. The protective case of claim 19, wherein the at least one of the inner ribs positioned on the button panel is positioned at one end of the button panel.

* * * * *